(12) United States Patent
Jin et al.

(10) Patent No.: US 11,398,513 B2
(45) Date of Patent: Jul. 26, 2022

(54) IMAGE SENSOR

(71) Applicant: SAMSUNG ELECTRONICS CO., LTD., Suwon-si (KR)

(72) Inventors: Younggu Jin, Suwon-si (KR); Taesub Jung, Hwaseong-si (KR); Youngchan Kim, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 152 days.

(21) Appl. No.: 16/870,350

(22) Filed: May 8, 2020

(65) Prior Publication Data

US 2021/0134867 A1    May 6, 2021

(30) Foreign Application Priority Data

Nov. 4, 2019  (KR) .................. 10-2019-0139415

(51) Int. Cl.
*H01L 27/146*    (2006.01)

(52) U.S. Cl.
CPC .... *H01L 27/14625* (2013.01); *H01L 27/1462* (2013.01); *H01L 27/1463* (2013.01); *H01L 27/14643* (2013.01)

(58) Field of Classification Search
CPC .......... H01L 27/14625; H01L 27/1462; H01L 27/1463; H01L 27/14643; H01L 27/14627; H01L 27/14636; H01L 27/14621; H01L 27/14603; H01L 27/14609; H01L 27/14645; H01L 27/14689
See application file for complete search history.

(56) References Cited

U.S. PATENT DOCUMENTS

| 7,113,335 | B2 | 9/2006 | Sales |
| 7,968,804 | B2 | 6/2011 | Frey et al. |
| 8,611,007 | B2 | 12/2013 | Davis |
| 8,913,320 | B2 | 12/2014 | Davis et al. |
| 9,759,947 | B2 | 9/2017 | Liu et al. |
| 2018/0136382 | A1 | 5/2018 | Kwak et al. |
| 2018/0302597 | A1* | 10/2018 | Honda ............. H01L 27/14645 |
| 2019/0006407 | A1* | 1/2019 | Uesaka ............ H01L 27/14625 |
| 2019/0148437 | A1* | 5/2019 | Cheng ................. G02B 5/3008 257/432 |
| 2020/0029047 | A1 | 1/2020 | Jin et al. |

FOREIGN PATENT DOCUMENTS

KR    10-2020-0105584 A    9/2020

* cited by examiner

*Primary Examiner* — Jonathan Han
(74) *Attorney, Agent, or Firm* — Sughrue Mion, PLLC

(57) ABSTRACT

An image sensor includes a substrate having a first surface and a second surface opposite to each other, a photoelectric conversion region provided in the substrate, and a polarizer provided at the first surface of the substrate. The polarizer includes a lower structure comprising at least one trench recessed from the first surface of the substrate toward the photoelectric conversion region, and a plurality of upper patterns provided on the lower structure and spaced apart from each other in a first direction parallel to the first surface.

20 Claims, 32 Drawing Sheets

IMAGE SENSOR

CROSS-REFERENCE TO THE RELATED APPLICATION

This application is based on and claims priority under 35 U.S.C. § 119 from Korean Patent Application No. 10-2019-0139415, filed on Nov. 4, 2019, in the Korean Intellectual Property Office, the disclosure of which is hereby incorporated by reference in its entirety.

BACKGROUND

Embodiments of the disclosure relate to an image sensor and, more particularly, to a complementary metal-oxide-semiconductor (CMOS) image sensor.

Image sensors are semiconductor devices that convert optical images into electrical signals. With recent developments in computer and electronic device technologies, high-performance image sensors have been increasingly demanded in various fields such as a digital camera, a camcorder, a personal communication system (PCS), a game console, a security camera, and a medical micro camera. Recently, image sensors for realizing three-dimensional (3D) images as well as color images have been developed.

SUMMARY

Embodiments of the disclosure may provide an image sensor capable of improving sensitivity of incident light and capable of sensing polarization.

According to an aspect of the disclosure, there is provided an image sensor may include a substrate having a first surface and a second surface opposite to each other, a photoelectric conversion region provided in the substrate, and a polarizer provided at the first surface of the substrate. The polarizer may include a lower structure comprising at least one trench recessed from the first surface of the substrate toward the photoelectric conversion region, and a plurality of upper patterns provided on the lower structure and spaced apart from each other in a first direction parallel to the first surface.

According to another aspect of the disclosure, there is provided an image sensor may include a substrate having a first surface and a second surface opposite to each other, device isolation patterns provided in the substrate, a photoelectric conversion region provided in the substrate and provided between the device isolation patterns, and a polarizer provided at the first surface of the substrate. The polarizer may include a lower structure comprising a plurality of lower patterns protruding from the substrate and lower insulating patterns provided between the lower patterns, and upper patterns provided on the lower structure. The lower structure may be provided between the photoelectric conversion region and the upper patterns and between the device isolation patterns.

According to another aspect of the disclosure, there is provided an image sensor comprising: a pixel array including a plurality of unit pixels two-dimensionally arranged in a first direction and a second direction D2 intersecting the first direction, wherein each of the plurality of unit pixels comprises: a substrate; a photoelectric conversion region provided in the substrate; and a polarizer provided at a surface of the substrate, wherein the polarizer comprises: a lower structure comprising at least one trench recessed from the surface of the substrate toward the photoelectric conversion region; and a plurality of upper patterns provided on the lower structure and spaced apart from each other in a first direction parallel to the surface, wherein the polarizer of a first unit pixel, among the plurality of unit pixels, has a different polarization axis, than the polarizer of a second unit pixel, among the plurality of unit pixels.

BRIEF DESCRIPTION OF THE DRAWINGS

The disclosure will become more apparent in view of the attached drawings and accompanying detailed description.

DETAILED DESCRIPTION OF THE EMBODIMENTS

Hereinafter, embodiments of the disclosure will be described in detail with reference to the accompanying drawings.

Figure 1:
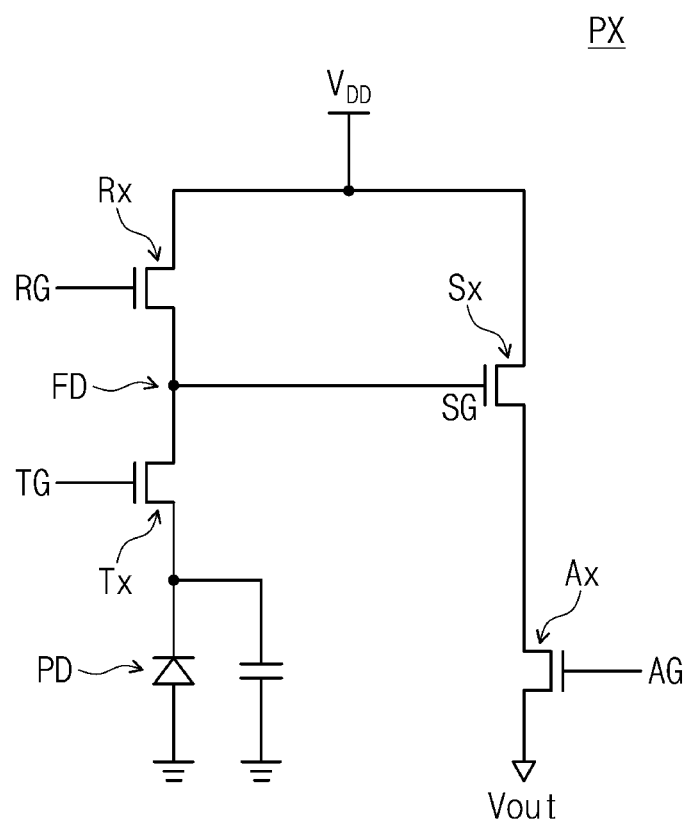
FIG. 1 is a circuit diagram of a pixel of an image sensor according to some embodiments of the disclosure.

FIG. 1 is a circuit diagram of a pixel of an image sensor according to some embodiments of the disclosure.

Referring to FIG. 1, a unit pixel PX of an image sensor may include a photoelectric conversion element PD, a transfer transistor Tx, a source follower transistor Sx, a reset transistor Rx, and a selection transistor Ax. The transfer transistor Tx may include a transfer gate TG, the source follower transistor Sx may include a source follower gate SG, the reset transistor Rx may include a reset gate RG, and the selection transistor Ax may include a selection gate AG.

The photoelectric conversion element PD may be a photodiode including a P-type dopant region and an N-type dopant region. A floating diffusion region FD may function as a drain of the transfer transistor Tx. The floating diffusion region FD may also function as a source of the reset transistor Rx. The floating diffusion region FD may be electrically connected to the source follower gate SG of the source follower transistor Sx. The source follower transistor Sx may be connected to the selection transistor Ax.

The operation of the image sensor according to some embodiments of the disclosure will be described hereinafter with reference to FIG. 1. Light incident from the outside may generate electron-hole pairs in the photoelectric conversion element PD. The holes may be moved into and accumulated in the P-type dopant region of the photoelectric conversion element PD, and the electrons may be moved into and accumulated in the N-type dopant region of the photoelectric conversion element PD. In a state in which the electrons are blocked from moving into the floating diffusion region FD, a power voltage VDD may be applied to a drain of the reset transistor Rx and a drain of the source follower transistor Sx, and the reset transistor Rx may be turned-on to discharge charges remaining in the floating diffusion region FD. Thereafter, the transfer transistor Tx may be turned-on to transfer charges (e.g., the electrons or the holes) into the floating diffusion region FD. The transferred charges may be accumulated in the floating diffusion region FD. A gate bias of the source follower transistor Sx may be changed in proportion to the amount of the charges accumulated in the floating diffusion region FD, thereby causing a change in potential of a source of the source follower transistor Sx. At this time, the selection transistor Ax may be turned-on, and thus a signal, (i.e., Vout) generated by the charges may be sensed through a column line.

The unit pixel PX including a single photoelectric conversion element PD and four transistors Tx, Rx, Ax and Sx is illustrated as an example in FIG. 1. However, embodiments of the disclosure are not limited thereto. In certain embodiments, the pixel PX may be provided in plurality, and the reset transistor Rx, the source follower transistor Sx and/or the selection transistor Ax may be shared by adjacent pixels PX. Thus, the integration density of the image sensor may be improved.

Figure 2:
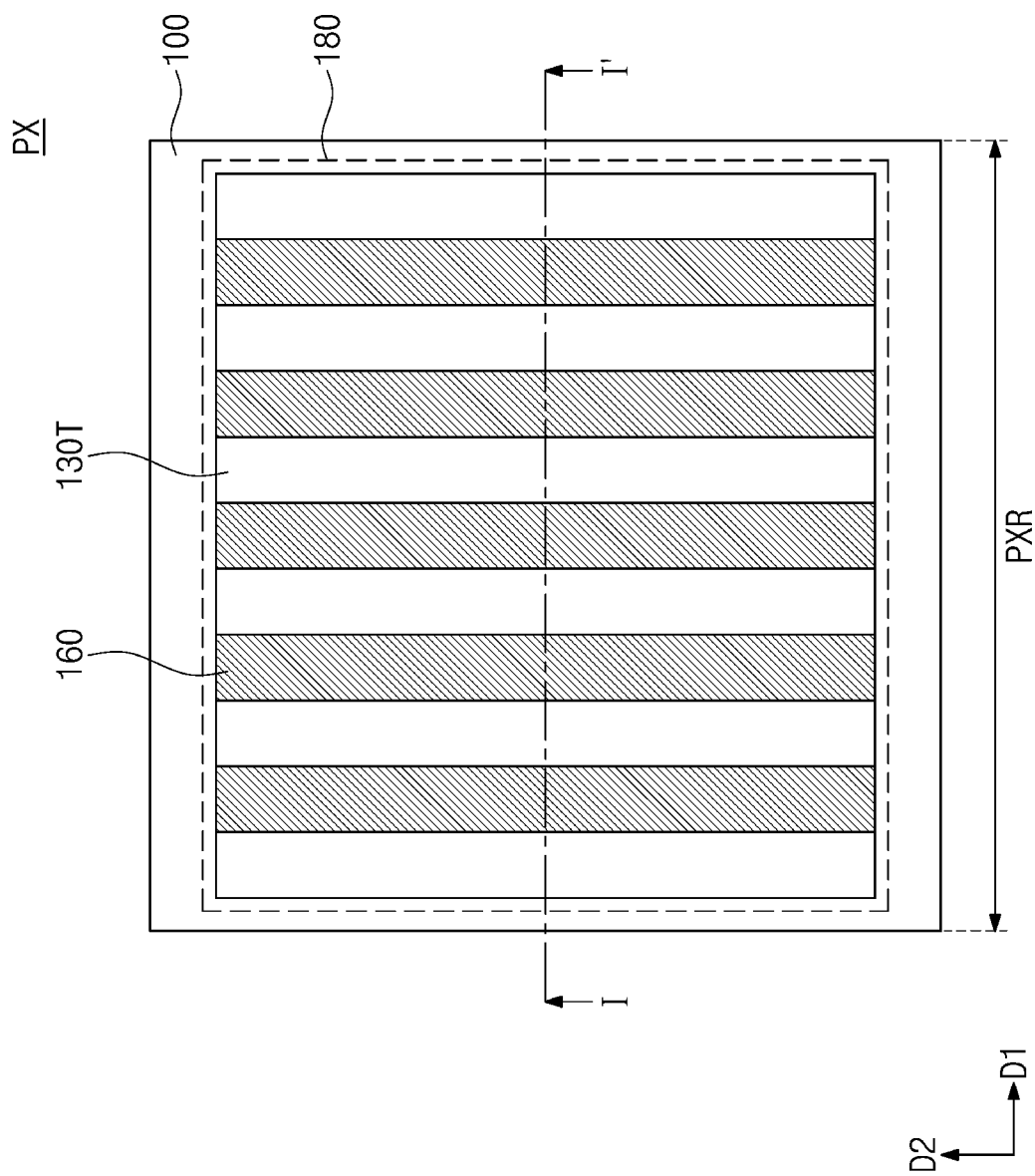
FIG. 2 is a plan view illustrating a pixel of an image sensor according to some embodiments of the disclosure.
Figure 3:
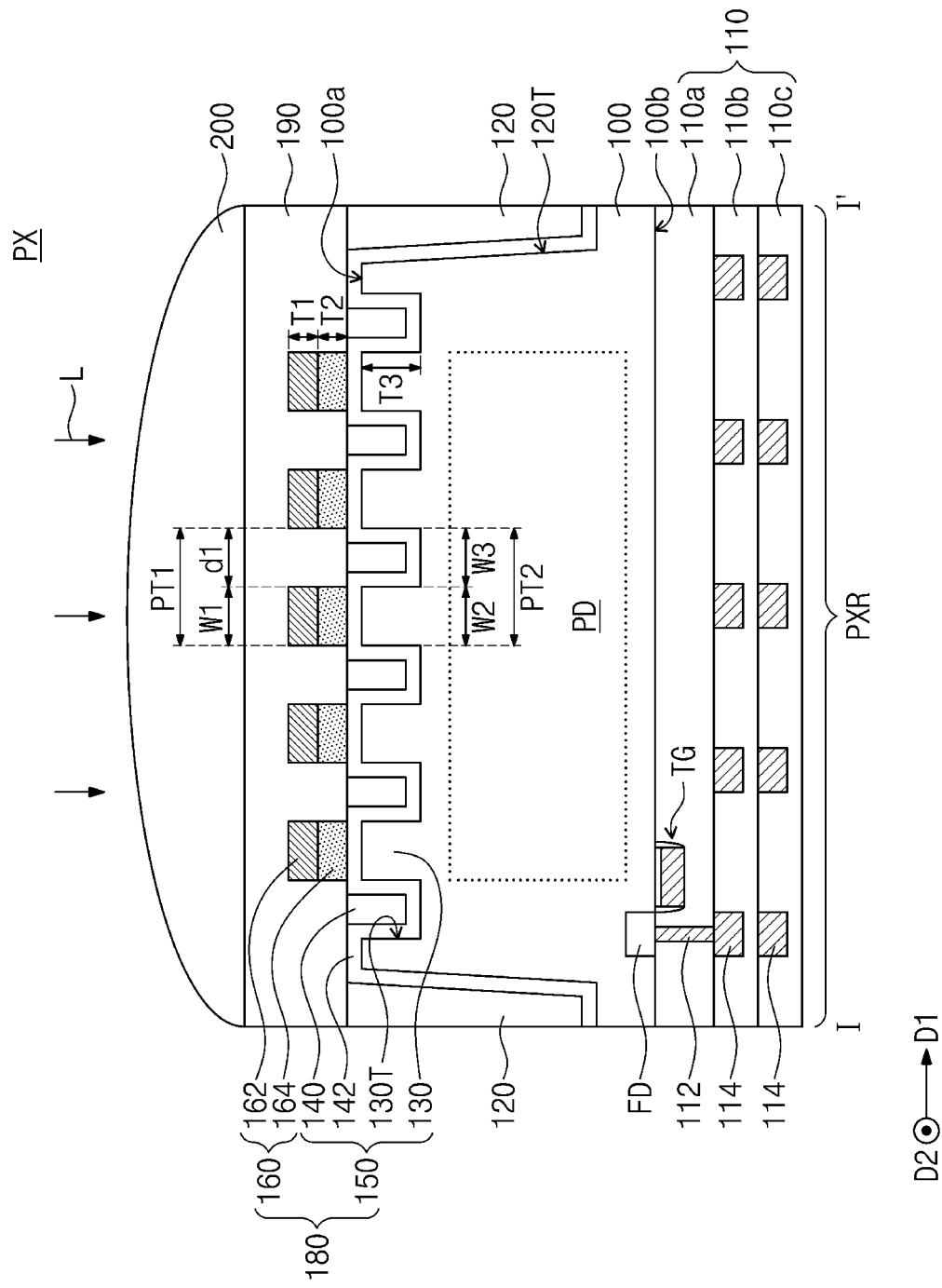
FIGS. 3 to 7 are cross-sectional views corresponding to the line I-I' of FIG. 2 to illustrate pixels of image sensors according to some embodiments of the disclosure.

FIG. 2 is a plan view illustrating a pixel of an image sensor according to some embodiments of the disclosure, and FIG. 3 is a cross-sectional view taken along a line I-I' of FIG. 2.

Referring to FIGS. 2 and 3, device isolation patterns 120 may be disposed in a substrate 100 to define a pixel region PXR. The substrate 100 may be a semiconductor substrate (e.g., a silicon substrate, a germanium substrate, a silicon-germanium substrate, a group II-VI compound semiconductor substrate, or a group III-V compound semiconductor substrate) or a silicon-on-insulator (SOI) substrate. The substrate 100 may have a first surface 100a and a second surface 100b which are opposite to each other. Each of the device isolation patterns 120 may penetrate at least a portion of the substrate 100. For example, each of the device isolation patterns 120 may extend from the first surface 100a of the substrate 100 into the substrate 100 and may be spaced apart from the second surface 100b of the substrate 100. Each of the device isolation patterns 120 may be disposed between pixel regions PXR adjacent to each other and may prevent crosstalk between the adjacent pixel regions PXR. The device isolation patterns 120 may be disposed to surround the pixel region PXR when viewed in a plan view. The device isolation patterns 120 may include an insulating material such as silicon oxide, silicon nitride, and/or silicon oxynitride.

A photoelectric conversion region PD may be disposed in the pixel region PXR. The photoelectric conversion region PD may be disposed between the device isolation patterns 120 in the substrate 100. The substrate 100 may have a first conductivity type, and the photoelectric conversion region PD may be a region doped with dopants having a second conductivity type different from the first conductivity type. For example, the first conductivity type and the second conductivity type may be a P-type and an N-type, respectively. In this case, the second conductivity type dopants may include N-type dopants such as phosphorus, arsenic, bismuth, and/or antimony. A photodiode may be formed by junction of the substrate 100 having the first conductivity type and the photoelectric conversion region PD having the second conductivity type. A floating diffusion region FD may be disposed in the pixel region PXR. The floating diffusion region FD may be disposed adjacent to the second surface 100b of the substrate 100 and may be a region doped with dopants having the second conductivity type.

A transfer gate TG may be disposed on the pixel region PXR and may be disposed on the second surface 100b of the substrate 100. The transfer gate TG may be disposed adjacent to the floating diffusion region FD. An interconnection structure 110 may be disposed on the second surface 100b of the substrate 100. The interconnection structure 110 may include a first interlayer insulating layer 110a, a second interlayer insulating layer 110b and a third interlayer insulating layer 110c, which are sequentially stacked on the second surface 100b of the substrate 100. The first interlayer insulating layer 110a may be in contact with the second surface 100b of the substrate 100 and may cover the transfer gate TG. The interconnection structure 110 may further include a via 112 penetrating the first interlayer insulating layer 110a, and interconnection lines 114 provided in the second and third interlayer insulating layers 110b and 110c. The via 112 may be connected to the floating diffusion region FD and may be connected to a corresponding one of the interconnection lines 114.

A polarizer 180 may be disposed on the pixel region PXR and may be disposed adjacent to the first surface 100a of the substrate 100. The polarizer 180 may include a lower structure 150 and a plurality of upper patterns 160 disposed on the lower structure 150. The lower structure 150 may include a plurality of trenches 130T recessed from the first surface 100a of the substrate 100 into the substrate 100. The lower structure 150 may include a plurality of lower patterns 130 defined by the plurality of trenches 130T. The lower patterns 130 may be protruding portions of the substrate 100, which are disposed between the trenches 130T. Topmost surfaces of the lower patterns 130 may correspond to the first surface 100a of the substrate 100. The trenches 130T and the lower patterns 130 may be disposed between the device isolation patterns 120 and on the photoelectric conversion region PD.

In some embodiments, the trenches 130T may be spaced apart from each other in a first direction D1 parallel to the first surface 100a of the substrate 100. Each of the trenches 130T may have a line shape extending in a second direction which is parallel to the first surface 100a and intersects the first direction Dl. Each of the lower patterns 130 may have a line shape which extends in the second direction D2 between the trenches 130T in a plan view.

The lower structure 150 may further include a plurality of lower insulating patterns 140 disposed in the trenches 130T, respectively. In some embodiments, the lower insulating patterns 140 may be spaced apart from each other in the first direction D1 and may extend in the second direction D2. Each of the lower insulating patterns 140 may have a line shape extending in the second direction D2. The lower insulating patterns 140 and the lower patterns 130 may be alternately arranged in the first direction D1. The lower insulating patterns 140 may include an insulating material such as silicon oxide, silicon nitride, and/or silicon oxynitride.

The lower structure 150 may further include a passivation layer 142 disposed between the lower insulating patterns 140 and the lower patterns 130. The passivation layer 142 may extend between each of the lower insulating patterns 140 and the substrate 100 and may extend onto top surfaces of the lower patterns 130. The passivation layer 142 may cover the first surface 100a of the substrate 100. In some embodiments, the passivation layer 142 may also extend between each of the device isolation patterns 120 and the substrate 100. The passivation layer 142 may conformally cover an inner surface of each of the trenches 130T and may be disposed between the inner surface of each of the trenches 130T and each of the lower insulating patterns 140. For example, the passivation layer 142 may include an insulating layer (e.g., a silicon oxide layer, a silicon nitride layer, and/or a silicon oxynitride layer) and/or a metal oxide layer (e.g., an aluminum oxide layer, a hafnium oxide layer, and/or a tantalum oxide layer).

The upper patterns 160 may be disposed on the lower structure 150, and the lower structure 150 may be disposed between the photoelectric conversion region PD and the upper patterns 160. The upper patterns 160 and the lower structure 150 may vertically overlap with the photoelectric conversion region PD. Each of the upper patterns 160 may vertically overlap with at least one of the lower patterns 130 and the lower insulating patterns 140.

In some embodiments, the upper patterns 160 may be spaced apart from each other in the first direction D1 and may extend in the second direction D2. Each of the upper patterns 160 may have a line shape extending in the second direction D2. The upper patterns 160 may be aligned on the lower patterns 130, respectively. Each of the upper patterns 160 may include a first upper pattern 162 on the lower structure 150, and a second upper pattern 164 between the lower structure 150 and the first upper pattern 162. The first upper pattern 162 and the second upper pattern 164 may include materials having different refractive indexes. The first upper pattern 162 may include at least one of a metal (e.g., aluminum, tungsten, or copper) or a high-k dielectric material (e.g., SiN, $TiO_2$, or AlO), and the second upper pattern 164 may include a low-k dielectric material (e.g., SiO, SiN, SiON, SiC, SICN, or SiCO). The second upper pattern 164 may be in direct contact with the passivation layer 142 disposed on a corresponding one of the lower patterns 130.

Each of the upper patterns 160, the lower patterns 130 and the trenches 130T may have a width in the first direction D1. A first width W1 of each of the upper patterns 160 may be equal to or less than a second width W2 of each of the lower patterns 130 (i.e., W1≤W2) and may be equal to or less than a third width W3 of each of the trenches 130T (i.e., W1≤W3). In some embodiments, the first width W1 may be less than each of the second width W2 and the third width W3.

The upper patterns 160 may be spaced apart from each other by a first distance d1 in the first direction D1. A pitch PT1 of the upper patterns 160 may be a sum of the first width W1 of each of the upper patterns 160 and the first distance d1 between the upper patterns 160 (i.e., PT1=W1+d1), and a pitch PT2 of the lower patterns 130 may be a sum of the second width W2 of each of the lower patterns 130 and the third width W3 of each of the trenches 130T (i.e., PT2=W2+W3). The pitch PT1 of the upper patterns 160 may be equal to or less than the pitch PT2 of the lower patterns 130 (i.e., PT1≤P12).

Each of the first upper pattern 162, the second upper pattern 164 and the lower patterns 130 may have a thickness in a direction perpendicular to the first surface 100a of the substrate 100. A thickness T3 of each of the lower patterns 130 may be greater than a first thickness T1 of the first upper pattern 162 and may be greater than a second thickness T2 of the second upper pattern 164.

Light L incident on the first surface 100a of the substrate 100 may be polarized by the polarizer 180, and the polarized light L may be incident on the pixel region PXR. A polarization direction of the polarized light L may be perpendicular to the extending direction (e.g., the second direction D2) of the upper patterns 160 of the polarizer 180. The widths W1, W2 and W3 of the upper patterns 160, the lower patterns 130 and the trenches 130T and the thicknesses T1, T2 and T3 of the first and second upper patterns 162 and 164 and the lower patterns 130 may be changed to adjust a polarization state and a wavelength of the polarized light L.

A planarization layer 190 may be disposed on the first surface 100a of the substrate 100 to cover the polarizer 180. The planarization layer 190 may extend between the upper patterns 160 to cover the lower structure 150. For some examples, the planarization layer 190 may include $Al_2O_3$, $CeF_3$, $HfO_2$, ITO, MgO, $Ta_2O_5$, $TiO_2$, $ZrO_2$, Si, Ge, ZnSe, ZnS, and/or $PbF_2$. For other examples, the planarization layer 190 may include an organic material having a high refractive index such as siloxane resin, benzocyclobutene (BCB), polyimide-based resin, acrylic-based resin, parylene C, poly(methyl methacrylate) (PMMA), and/or polyethylene terephthalate (PET). For still other examples, the planarization layer 190 may include strontium titanate ($SrTiO_3$), polycarbonate, glass, bromine, sapphire, cubic zirconia, potassium niobate ($KNbO_3$), moissanite (SiC), gallium (III) phosphide (GaP), and/or gallium (III) arsenide (GaAs).

A micro lens 200 may be disposed on the planarization layer 190. The micro lens 200 may vertically overlap with the photoelectric conversion region PD. The micro lens 200 may change a light path of the light L to provide the light L to the pixel region PXR.

A method of forming the pixel PX of the image sensor according to some embodiments of the disclosure will be described hereinafter.

Referring again to FIGS. 2 and 3, the photoelectric conversion region PD may be formed in the substrate 100. The floating diffusion region FD may be formed in the substrate 100 and may be formed adjacent to the second surface 100b of the substrate 100. The transfer gate TG may be formed on the second surface 100b of the substrate 100 and may be formed adjacent to the floating diffusion region FD. The interconnection structure 110 may be formed on the second surface 100b of the substrate 100.

Device isolation trenches 120T and the trenches 130T may be formed in the substrate 100. The formation of the device isolation trenches 120T and the trenches 130T may include recessing the first surface 100a of the substrate 100. The device isolation trenches 120T may be deeper than the trenches 130T. Since the trenches 130T are formed, the substrate 100 may include the lower patterns 130 between the trenches 130T.

In some embodiments, the passivation layer 142 may be formed to fill a portion of each of the device isolation trenches 120T and the trenches 130T. The passivation layer 142 may conformally cover inner surfaces of the device isolation trenches 120T and the trenches 130T and may cover the first surface 100a of the substrate 100.

The device isolation patterns 120 and the lower insulating patterns 140 may be formed in the device isolation trenches 120T and the trenches 130T, respectively. For example, the formation of the device isolation patterns 120 and the lower insulating patterns 140 may include forming an insulating layer filling remaining portions of the device isolation trenches 120T and the trenches 130T on the first surface 100a of the substrate 100, and planarizing the insulating layer. The device isolation patterns 120 and the lower insulating patterns 140 may be locally formed in the device isolation trenches 120T and the trenches 130T by the planarization process. The trenches 130T, the lower patterns 130, the passivation layer 142 and the lower insulating patterns 140 may constitute the lower structure 150.

The upper patterns 160 may be formed on the lower structure 150. For example, the formation of the upper patterns 160 may include forming an upper layer on the lower structure 150, and patterning the upper layer. In some embodiments, the upper layer may include a first upper layer on the lower structure 150, and a second upper layer between the lower structure 150 and the first upper layer. The first upper layer may include at least one of a metal (e.g., tungsten or copper) or a high-k dielectric material (e.g., SiN, TiO$_2$, or AlO), and the second upper layer may include a low-k dielectric material (e.g., SiO, SiN, SiON, SiC, SICN, or SiCO). The lower structure 150 and the upper patterns 160 may constitute the polarizer 180.

The planarization layer 190 may be formed on the polarizer 180 and may fill spaces between the upper patterns 160. Thereafter, the micro lens 200 may be formed on the planarization layer 190.

According to the embodiments of the disclosure, the polarizer 180 may include the lower structure 150 including the trenches 130T and the lower patterns 130, and the upper patterns 160 on the lower structure 150. The first surface 100a of the substrate 100 may have an uneven structure by the trenches 130T and the lower patterns 130. In this case, the light L incident on the first surface 100a of the substrate 100 may be scattered by the uneven structure, and thus the light path of the light L may be increased. As a result, a light absorption rate in the pixel region PXR may be increased. In particular, when the light L is infrared light (e.g., near-infrared light), the light absorption rate in the pixel region PXR may be increased, and thus light sensitivity of the image sensor may be increased.

In addition, the trenches 130T and the lower patterns 130 may be formed by recessing the first surface 100a of the substrate 100. Thus, the process for forming the polarizer 180 may be easily performed. Furthermore, the polarization state and the wavelength of the light L may be adjusted by variously changing the widths W1, W2 and W3 of the upper patterns 160, the lower patterns 130 and the trenches 130T and the thicknesses T1, T2 and T3 of the upper patterns 160 and the lower patterns 130.

As a result, it is possible to easily manufacture the image sensor capable of increasing the sensitivity of the incident light L and of sensing the polarization of the light L.

Figure 4:
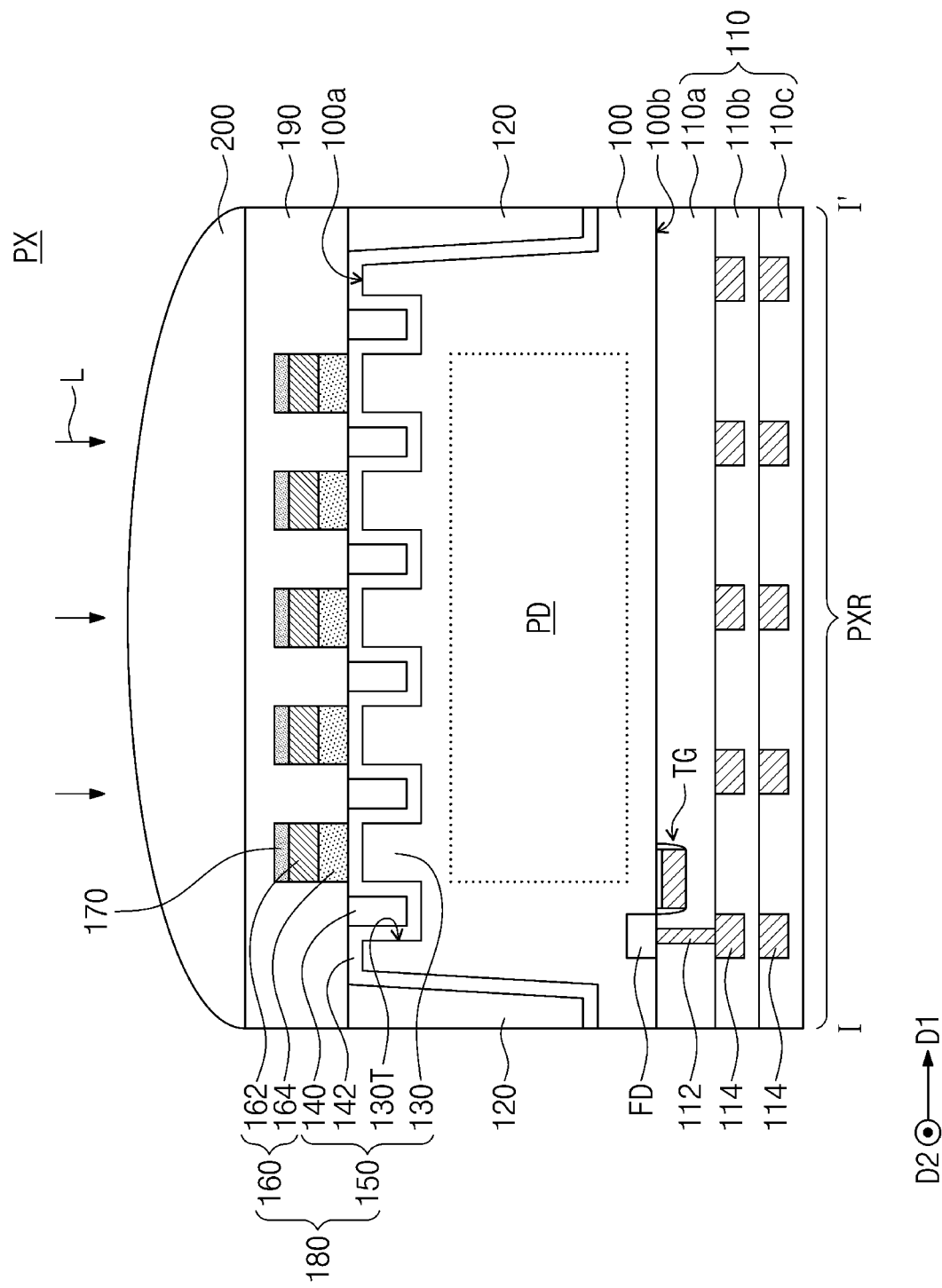

FIG. 4 is a cross-sectional view corresponding to the line I-I' of FIG. 2 to illustrate a pixel of an image sensor according to some embodiments of the disclosure. Hereinafter, differences between a pixel PX of the embodiments and the pixel PX mentioned with reference to FIGS. 2 and 3 will be mainly described for the purpose of ease and convenience in explanation.

Referring to FIGS. 2 and 4, anti-reflection patterns 170 may be disposed on the polarizer 180. The anti-reflection patterns 170 may be disposed on the upper patterns 160 of the polarizer 180, respectively. The anti-reflection patterns 170 may be spaced apart from each other in the first direction D1 and may extend in the second direction D2. Each of the anti-reflection patterns 170 may have a line shape extending in the second direction D2. For example, the anti-reflection patterns 170 may include SiN, SiON, SiC, SiCN, or SiCO.

Figure 5:
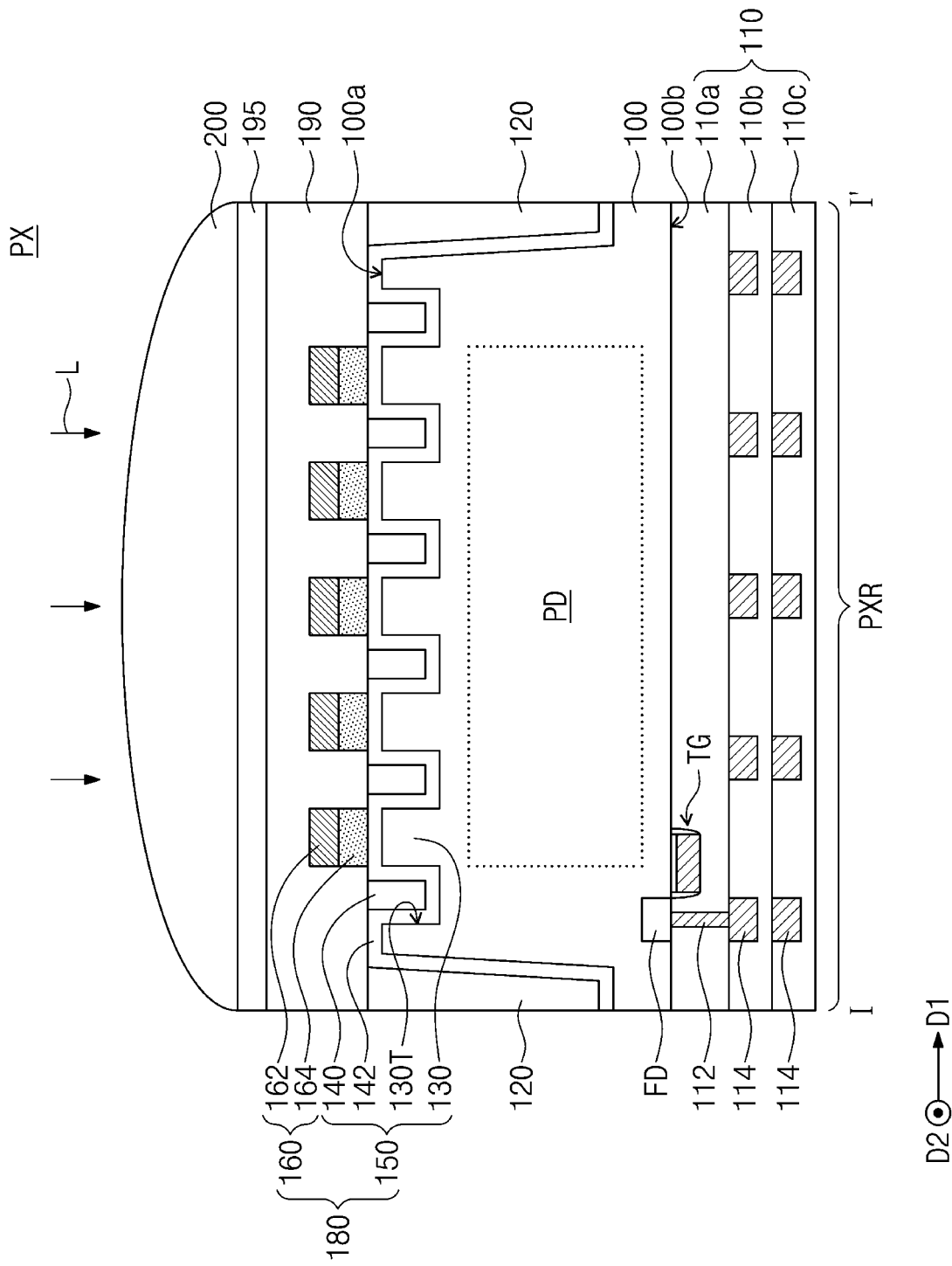

FIG. 5 is a cross-sectional view corresponding to the line I-I' of FIG. 2 to illustrate a pixel of an image sensor according to some embodiments of the disclosure. Hereinafter, differences between a pixel PX of the embodiments and the pixel PX mentioned with reference to FIGS. 2 and 3 will be mainly described for the purpose of ease and convenience in explanation.

Referring to FIGS. 2 and 5, an optical filter 195 may be disposed between the planarization layer 190 and the micro lens 200. The optical filter 195 may vertically overlap with the photoelectric conversion region PD. The optical filter 195 may be configured to filter light of a specific wavelength among the light L incident on the first surface 100a of the substrate 100. For example, the optical filter 195 may be a color filter for transmitting visible light of a specific color, or an infrared filter for transmitting infrared light.

Figure 6:
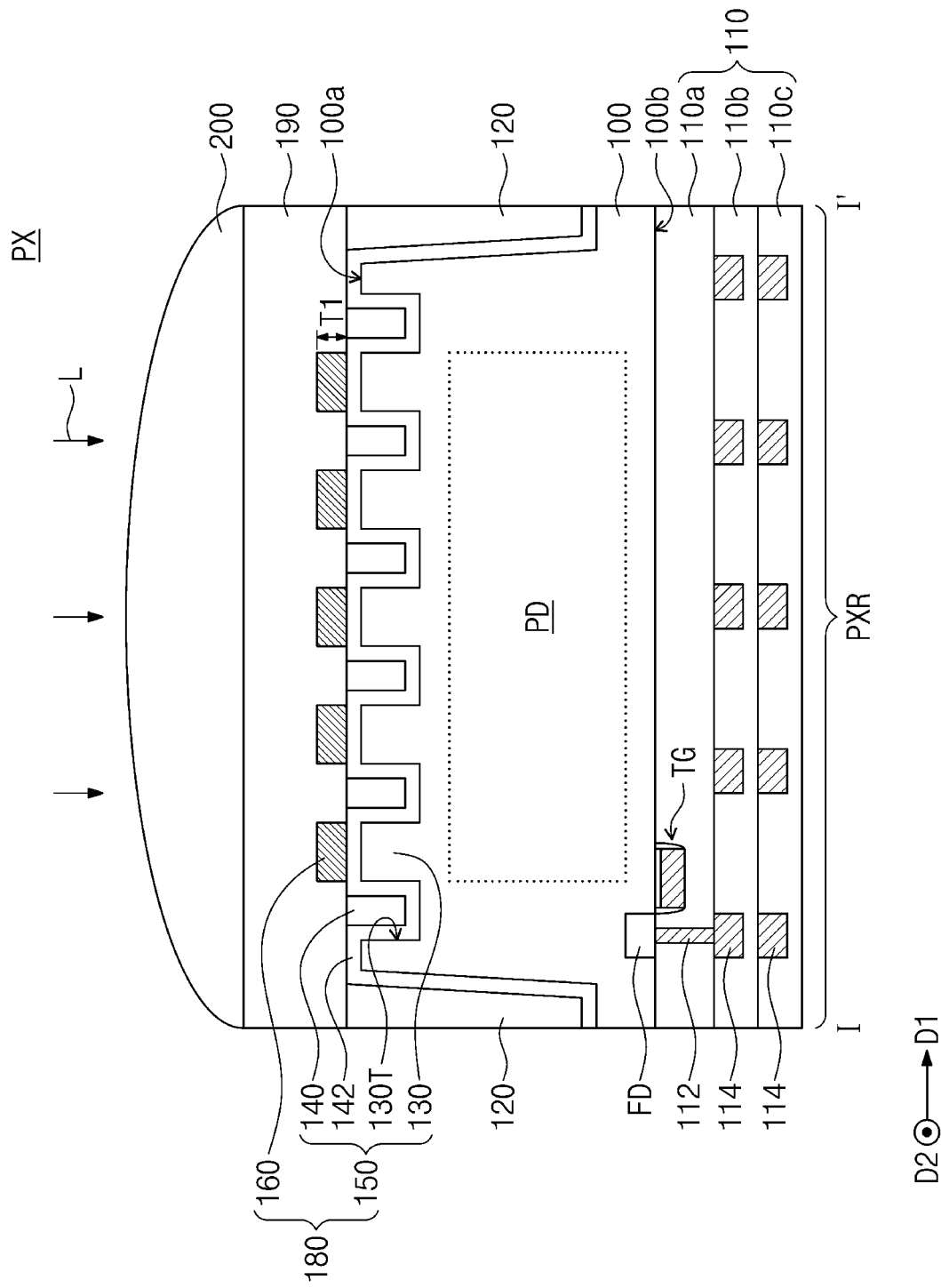

FIG. 6 is a cross-sectional view corresponding to the line I-I' of FIG. 2 to illustrate a pixel of an image sensor according to some embodiments of the disclosure. Hereinafter, differences between a pixel PX of the embodiments and the pixel PX mentioned with reference to FIGS. 2 and 3 will be mainly described for the purpose of ease and convenience in explanation.

Referring to FIGS. 2 and 6, the polarizer 180 may include the lower structure 150 including the trenches 130T and the lower patterns 130, and upper patterns 160 disposed on the lower structure 150. The lower structure 150 may also include the lower insulating patterns 140 disposed in the trenches 130T, respectively, and the passivation layer 142 disposed between the lower insulating patterns 140 and the lower patterns 130. According to the embodiments, each of the upper patterns 160 may be a single-layered pattern including at least one of a metal (e.g., tungsten or copper) or a high-k dielectric material (e.g., SiN, TiO$_2$, or AlO). In other words, each of the upper patterns 160 may be substantially the same as the first upper pattern 162 described with reference to FIGS. 2 and 3, and the second upper pattern 164 described with reference to FIGS. 2 and 3 may be omitted. Each of the upper patterns 160 may be in direct contact with the passivation layer 142 disposed on a corresponding one of the lower patterns 130. According to the embodiments, each of the upper patterns 160 may be formed of the single-layered pattern, and thus a patterning process for forming the upper patterns 160 may be easily performed. As a result, the polarizer 180 may be easily formed on the substrate 100.

Figure 7:
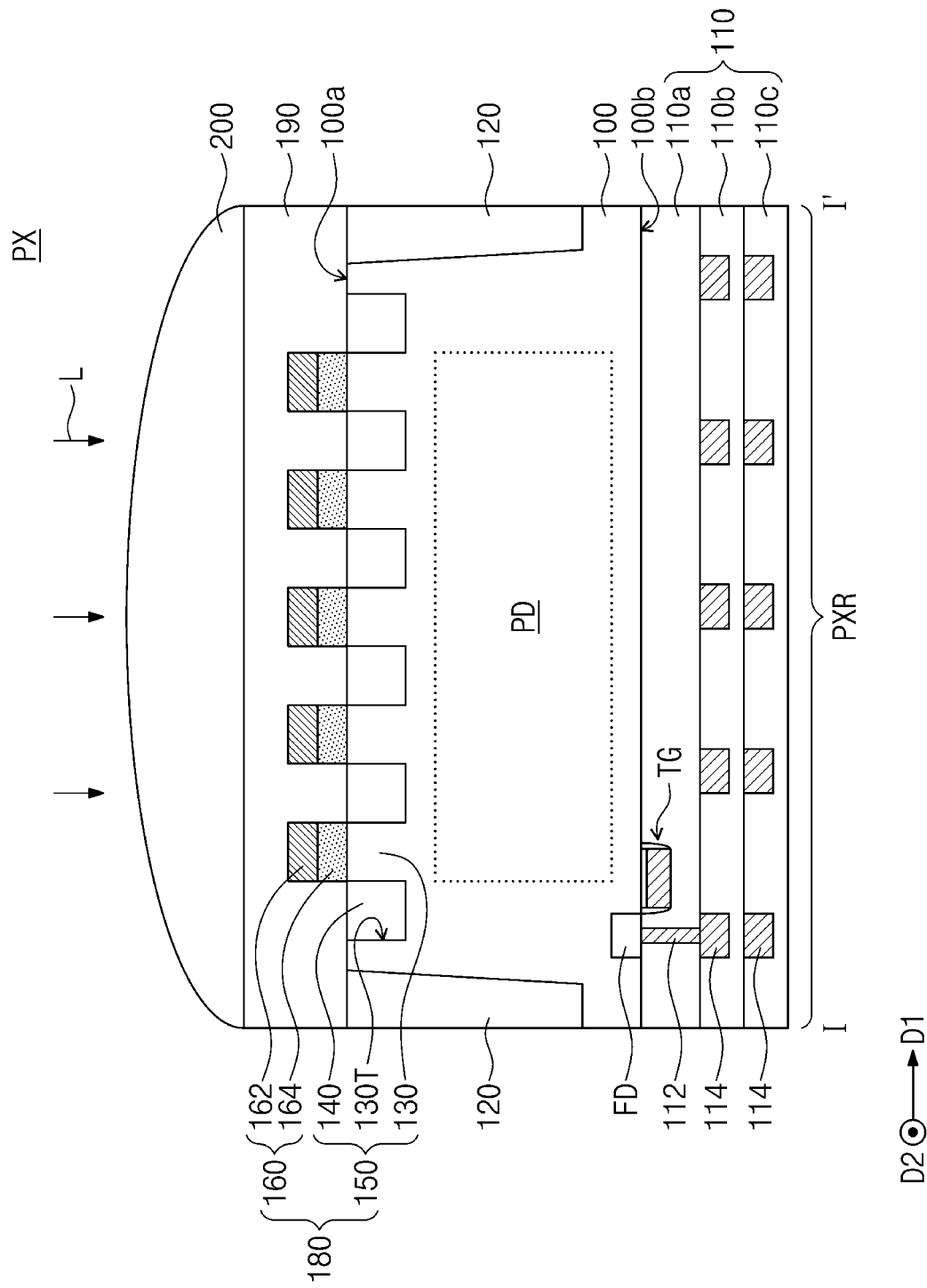

FIG. 7 is a cross-sectional view corresponding to the line I-I' of FIG. 2 to illustrate a pixel of an image sensor according to some embodiments of the disclosure. Hereinafter, differences between a pixel PX of the embodiments and the pixel PX mentioned with reference to FIGS. 2 and 3 will be mainly described for the purpose of ease and convenience in explanation.

Referring to FIGS. 2 and 7, the polarizer 180 may include the lower structure 150 including the trenches 130T and the lower patterns 130, and the upper patterns 160 disposed on the lower structure 150. The lower structure 150 may further include the lower insulating patterns 140 disposed in the trenches 130T, respectively. According to the embodiments, the lower insulating patterns 140 may be in direct contact with sidewalls of the lower patterns 130. In other words, the passivation layer 142 described with reference to FIGS. 2 and 3 may be omitted. Each of the upper patterns 160 may include the first upper pattern 162 on the lower structure 150, and the second upper pattern 164 between the lower structure 150 and the first upper pattern 162. The second upper pattern 164 may be in direct contact with a corresponding one of the lower patterns 130.

Figure 8:
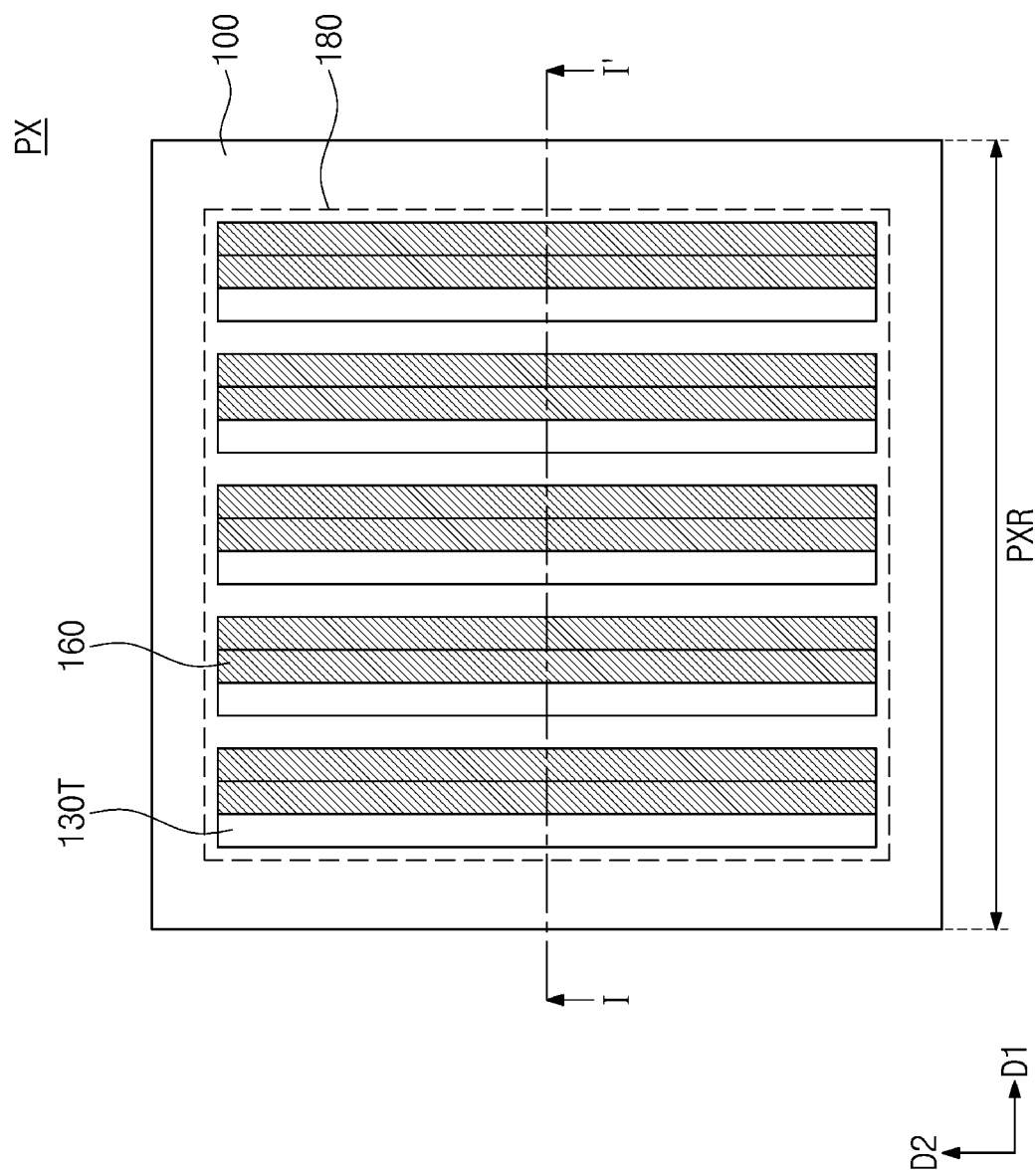
FIG. 8 is a plan view illustrating a pixel of an image sensor according to some embodiments of the disclosure.
Figure 9:
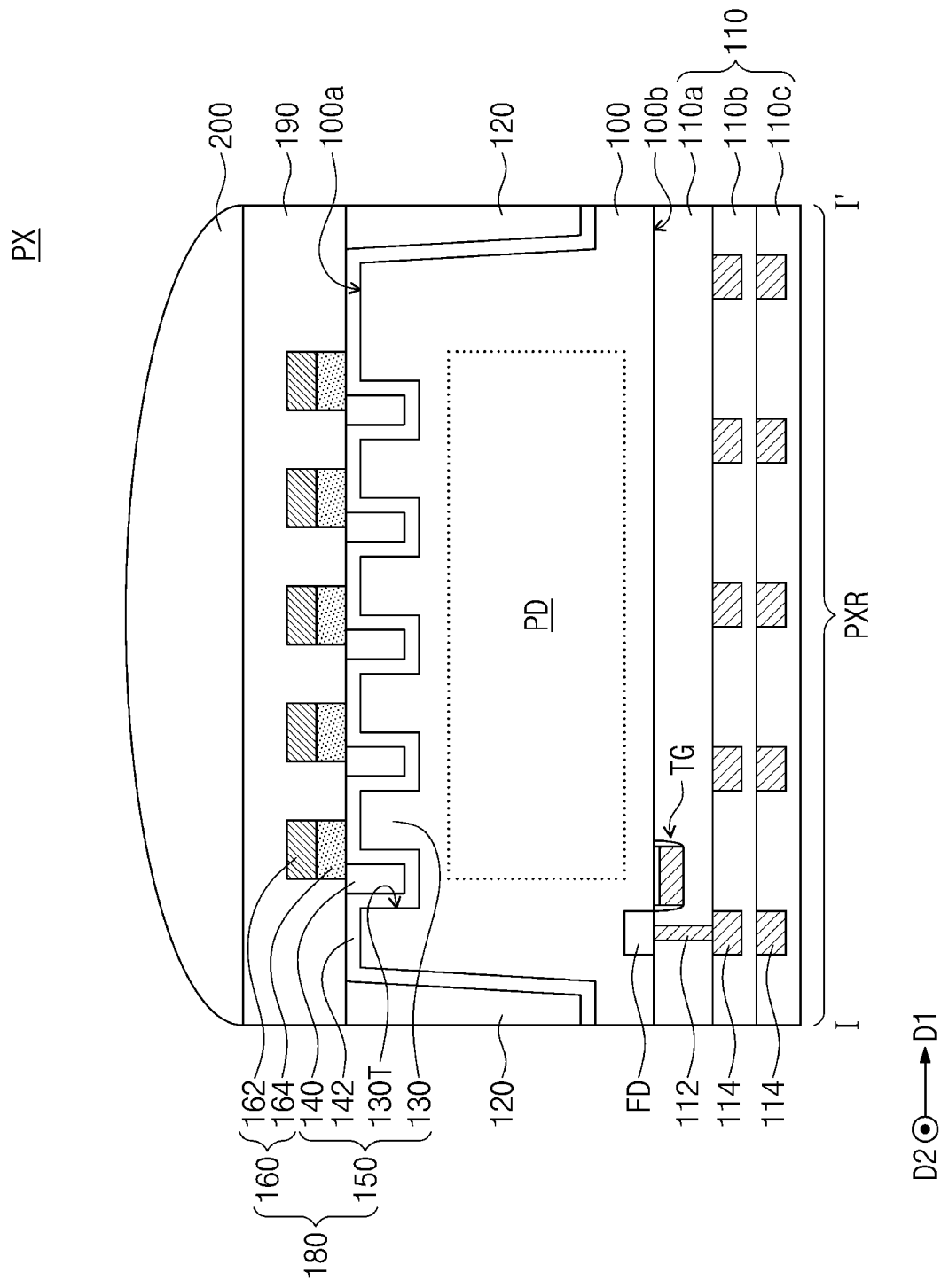
FIG. 9 is a cross-sectional view taken along a line I-I' of FIG. 8.

FIG. 8 is a plan view illustrating a pixel of an image sensor according to some embodiments of the disclosure, and FIG. 9 is a cross-sectional view taken along a line I-I' of FIG. 8. Hereinafter, differences between a pixel PX of the embodiments and the pixel PX mentioned with reference to FIGS. 2 and 3 will be mainly described for the purpose of ease and convenience in explanation.

Referring to FIGS. 8 and 9, the polarizer 180 may include the lower structure 150 including the trenches 130T and the lower patterns 130, and the upper patterns 160 disposed on the lower structure 150. The lower structure 150 may also include the lower insulating patterns 140 disposed in the trenches 130T, respectively, and the passivation layer 142 disposed between the lower insulating patterns 140 and the lower patterns 130. The passivation layer 142 may extend between each of the lower insulating patterns 140 and the substrate 100 and may extend onto the top surfaces of the lower patterns 130.

According to the embodiments, the upper patterns 160 may be spaced apart from each other in the first direction D1 and may extend in the second direction D2. Each of the upper patterns 160 may have a line shape extending in the second direction D2. Each of the upper patterns 160 may vertically overlap with a corresponding one of the lower patterns 130 and a corresponding one of the lower insulating patterns 140. Each of the upper patterns 160 may be disposed on a boundary of a corresponding one of the trenches 130T and the corresponding lower pattern 130 and may vertically overlap with a portion of the corresponding lower pattern 130 and a portion of the corresponding lower insulating pattern 140.

Each of the upper patterns 160 may include the first upper pattern 162 on the lower structure 150, and the second upper pattern 164 between the lower structure 150 and the first upper pattern 162. The second upper pattern 164 may be in direct contact with the passivation layer 142 disposed on a corresponding one of the lower patterns 130 and may be in direct contact with a corresponding one of the lower insulating patterns 140.

Figure 10:
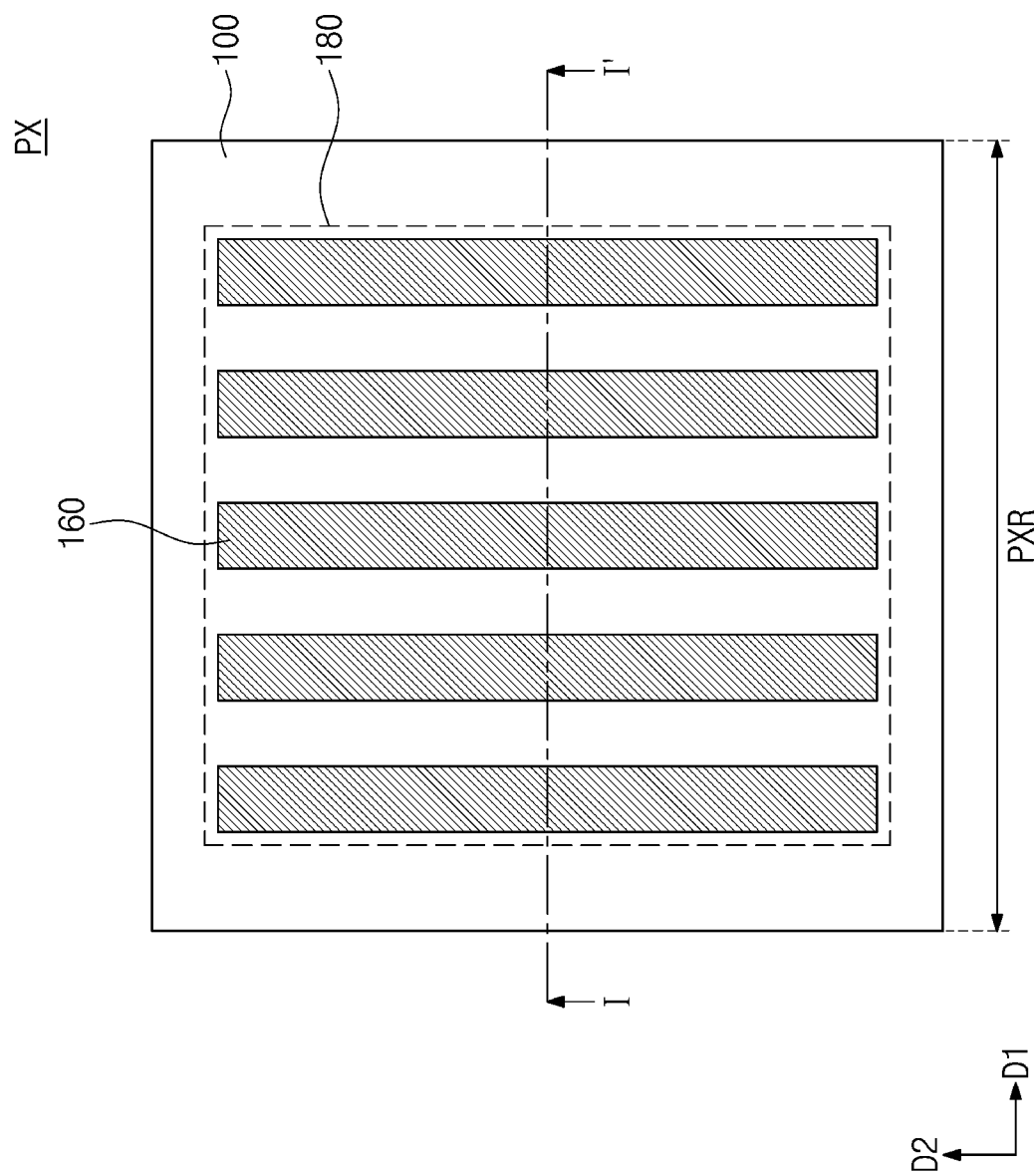
FIG. 10 is a plan view illustrating a pixel of an image sensor according to some embodiments of the disclosure.
Figure 11:
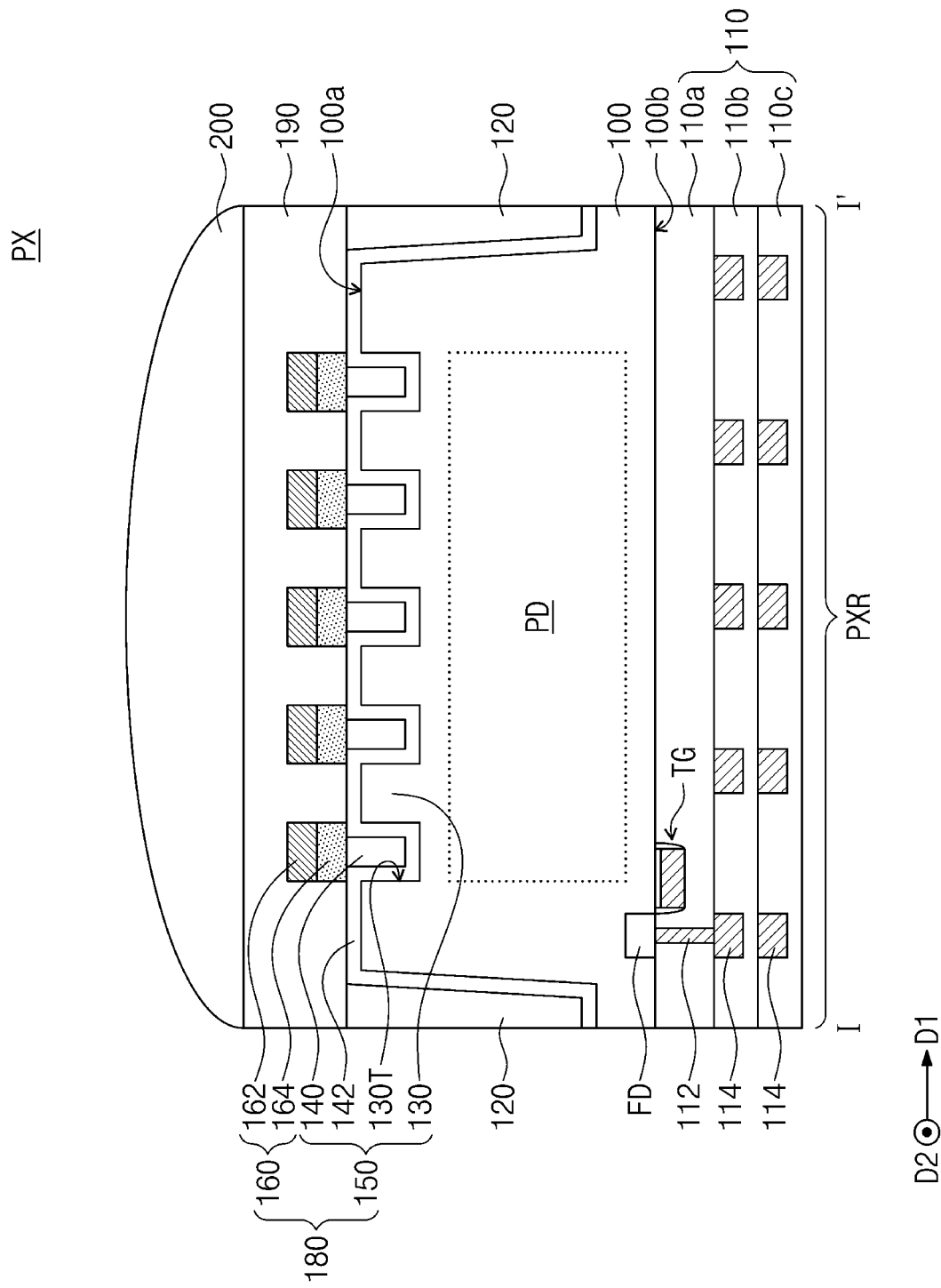
FIG. 11 is a cross-sectional view taken along a line I-I' of FIG. 10.

FIG. 10 is a plan view illustrating a pixel of an image sensor according to some embodiments of the disclosure, and FIG. 11 is a cross-sectional view taken along a line I-I' of FIG. 10. Hereinafter, differences between a pixel PX of the embodiments and the pixel PX mentioned with reference to FIGS. 2 and 3 will be mainly described for the purpose of ease and convenience in explanation.

Referring to FIGS. 10 and 11, the polarizer 180 may include the lower structure 150 including the trenches 130T and the lower patterns 130, and the upper patterns 160 disposed on the lower structure 150. The lower structure 150 may also include the lower insulating patterns 140 disposed in the trenches 130T, respectively, and the passivation layer 142 disposed between the lower insulating patterns 140 and the lower patterns 130. The passivation layer 142 may extend between each of the lower insulating patterns 140 and the substrate 100 and may extend onto the top surfaces of the lower patterns 130.

According to the embodiments, the upper patterns 160 may be spaced apart from each other in the first direction D1 and may extend in the second direction D2. Each of the upper patterns 160 may have a line shape extending in the second direction D2. The upper patterns 160 may be aligned on the lower insulating patterns 140, respectively. Each of the upper patterns 160 may include the first upper pattern 162 on the lower structure 150, and the second upper pattern 164 between the lower structure 150 and the first upper pattern 162. The second upper pattern 164 may be in direct contact with a corresponding one of the lower insulating patterns 140.

Figure 12:
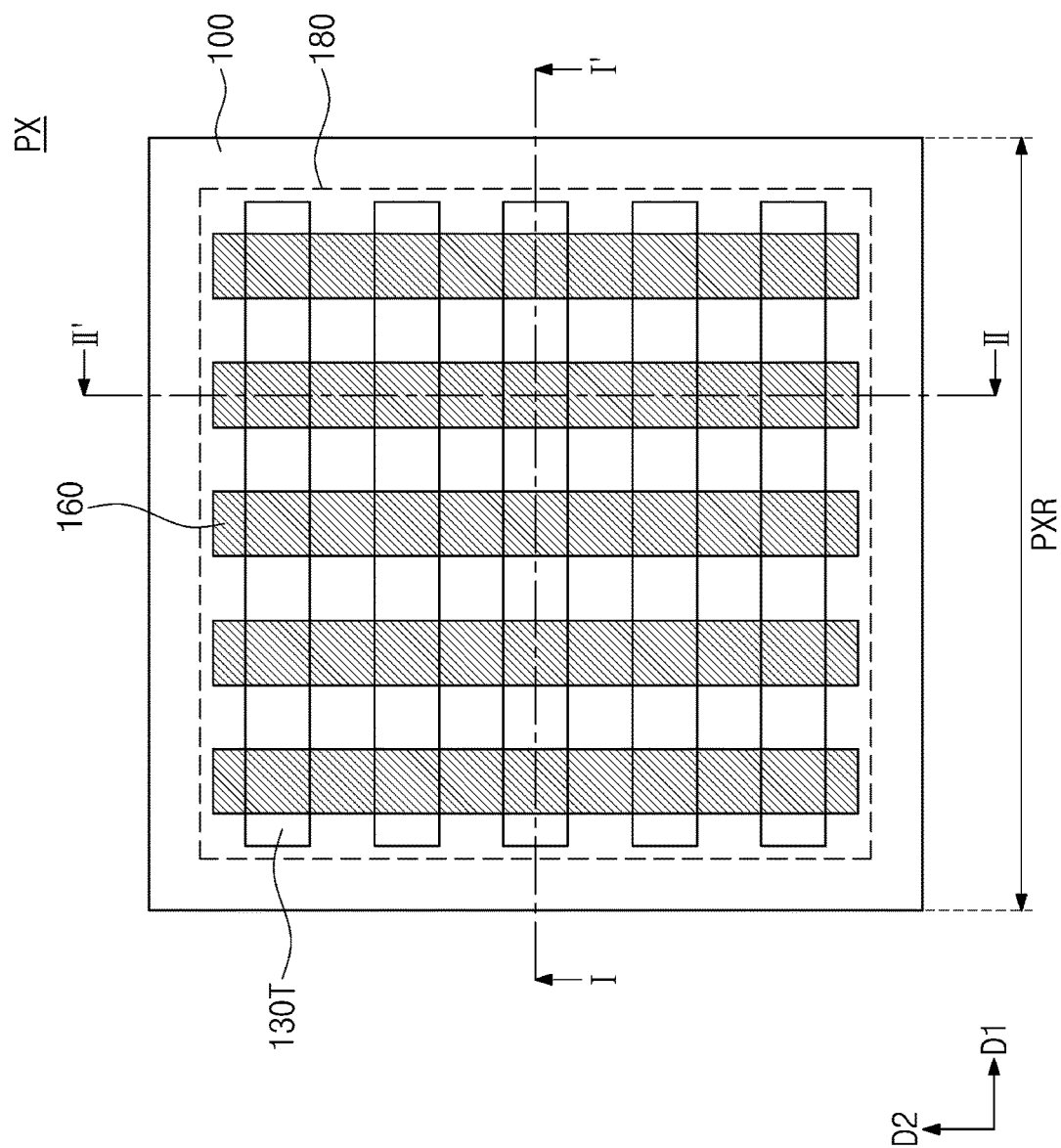
FIG. 12 is a plan view illustrating a pixel of an image sensor according to some embodiments of the disclosure.
Figure 13:
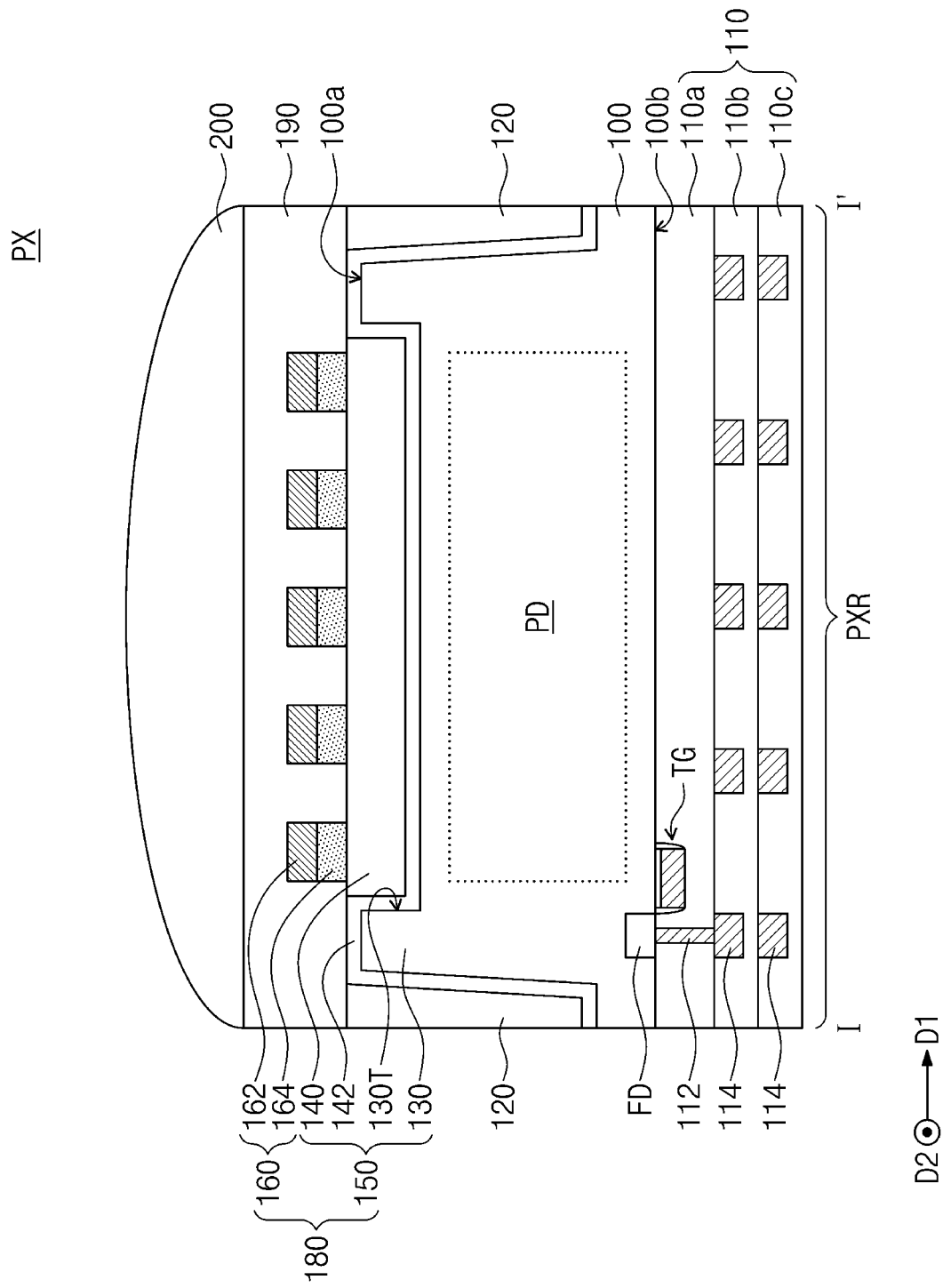
FIGS. 13 and 14 are cross-sectional views taken along lines I-I' and II-II' of FIG. 12, respectively.
Figure 14:
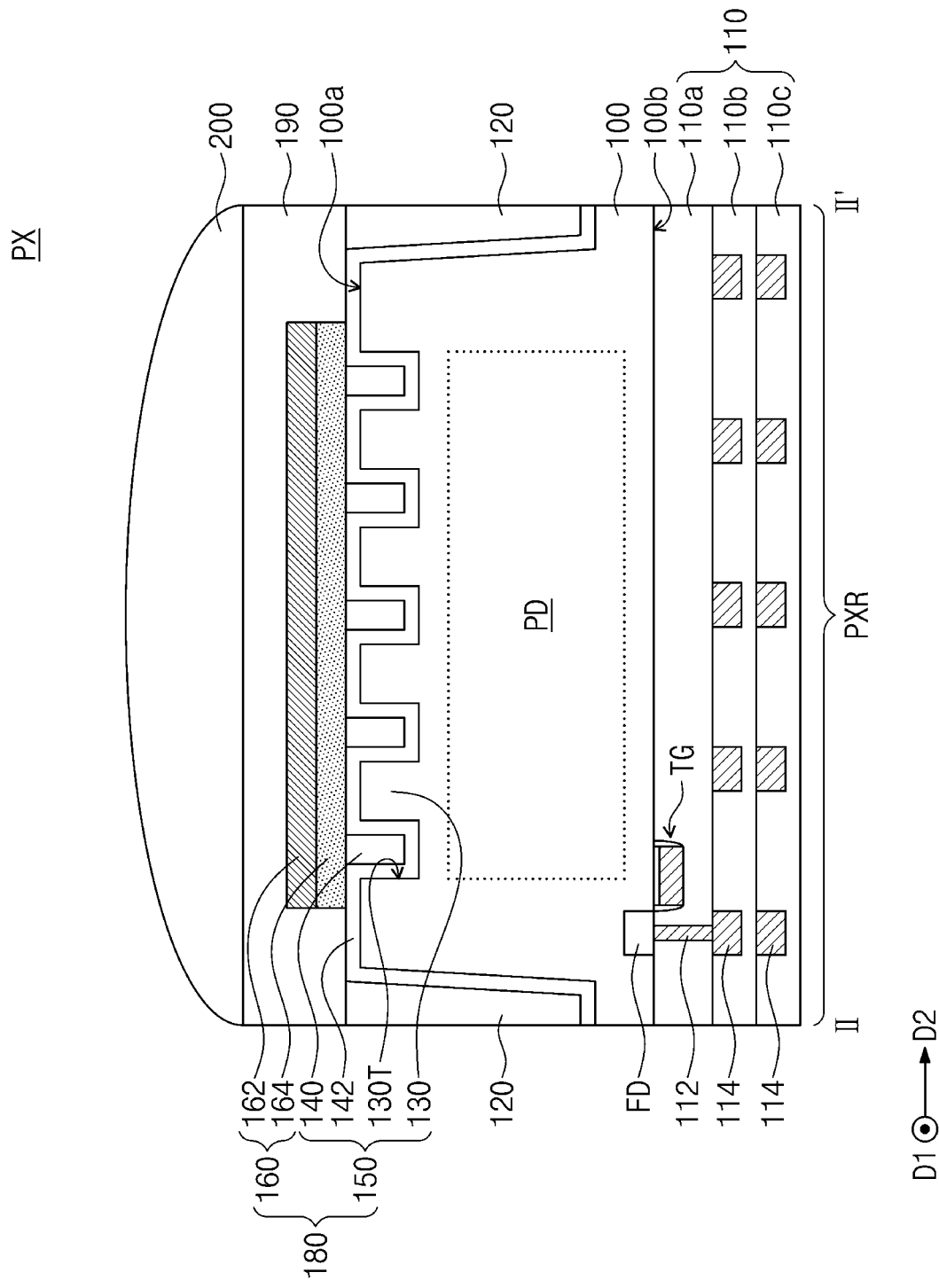

FIG. 12 is a plan view illustrating a pixel of an image sensor according to some embodiments of the disclosure, and FIGS. 13 and 14 are cross-sectional views taken along lines I-I' and II-II' of FIG. 12, respectively. Hereinafter, differences between a pixel PX of the embodiments and the pixel PX mentioned with reference to FIGS. 2 and 3 will be mainly described for the purpose of ease and convenience in explanation.

Referring to FIGS. 12, 13 and 14, the polarizer 180 may include a lower structure 150 including trenches 130T and lower patterns 130, and the upper patterns 160 disposed on the lower structure 150. The lower structure 150 may also include the lower insulating patterns 140 disposed in the trenches 130T, respectively, and the passivation layer 142 disposed between the lower insulating patterns 140 and the lower patterns 130. The passivation layer 142 may extend between each of the lower insulating patterns 140 and the substrate 100 and may extend onto top surfaces of the lower patterns 130.

According to the embodiments, the trenches 130T may extend in the first direction D1 and may be spaced apart from each other in the second direction D2. Each of the trenches 130T may have a line shape extending in the first direction D1. Each of the lower patterns 130 may have a line shape which extends in the first direction D1 between the trenches 130T. The lower insulating patterns 140 may extend in the first direction D1 and may be spaced apart from each other in the second direction D2. Each of the lower insulating patterns 140 may have a line shape extending in the first direction Dl. The lower insulating patterns 140 and the lower patterns 130 may be alternately arranged in the second direction D2.

The upper patterns 160 may be disposed on the lower structure 150 and may intersect the trenches 130T, the lower patterns 130, and the lower insulating patterns 140. The upper patterns 160 may be spaced apart from each other in the first direction D1 and may extend in the second direction D2. Each of the upper patterns 160 may have a line shape extending in the second direction D2. Each of the upper patterns 160 may intersect the trenches 130T, the lower patterns 130, and the lower insulating patterns 140. Each of the upper patterns 160 may include the first upper pattern 162 on the lower structure 150, and the second upper pattern 164 between the lower structure 150 and the first upper pattern 162. The second upper pattern 164 may be in direct contact with the passivation layer 142 on the lower patterns 130, and the lower insulating patterns 140.

Figure 15:
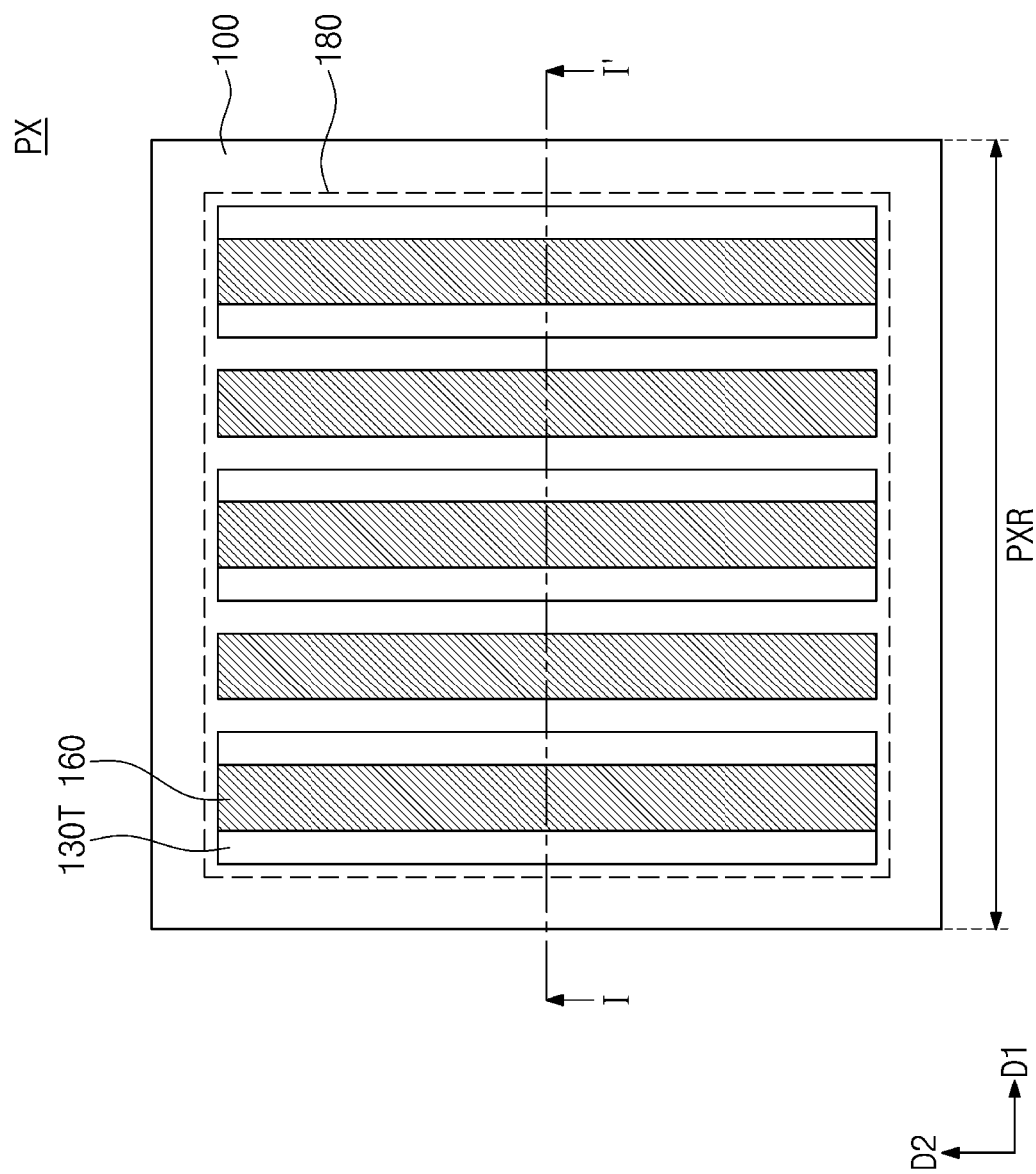
FIG. 15 is a plan view illustrating a pixel of an image sensor according to some embodiments of the disclosure.
Figure 16:
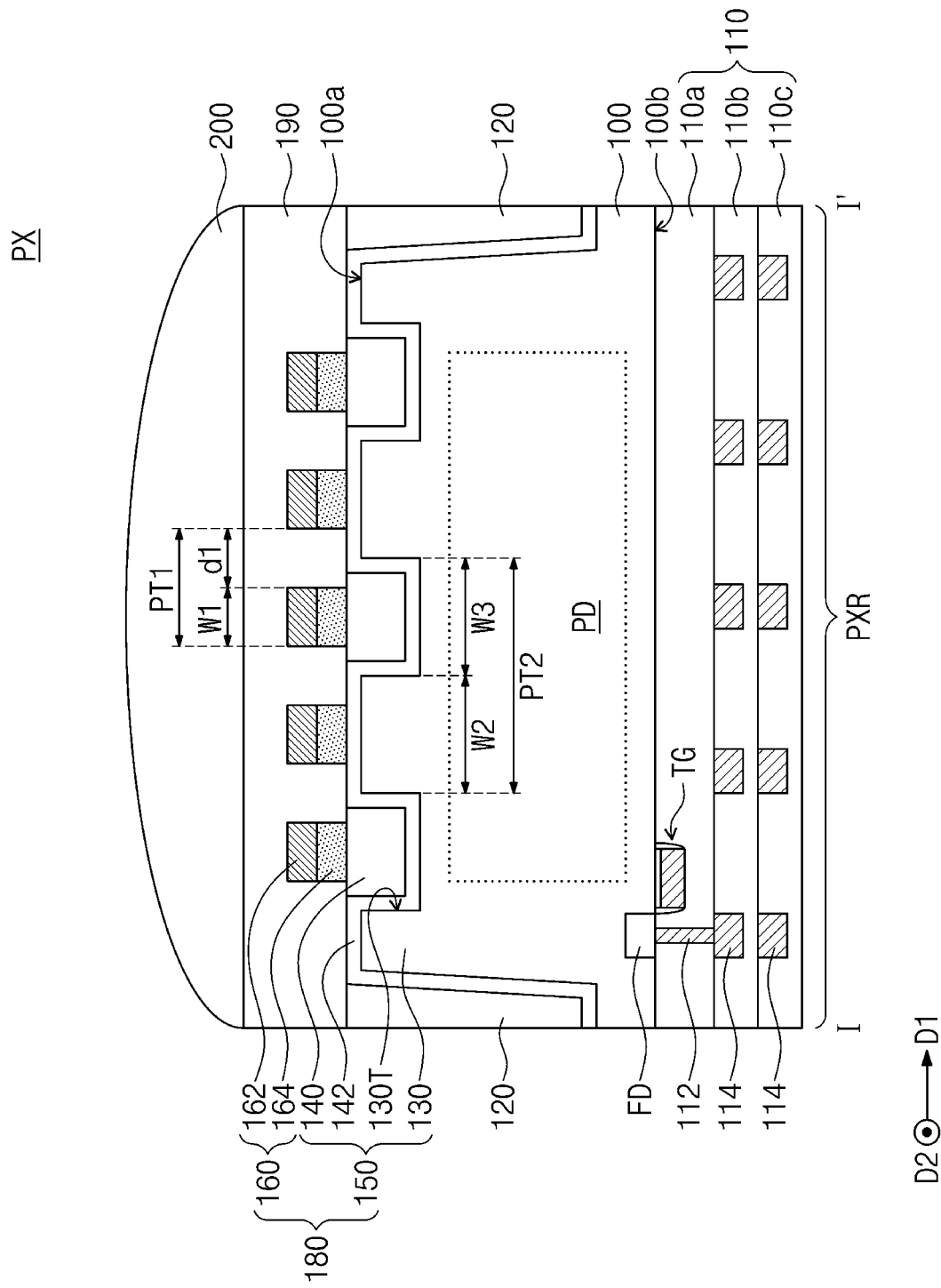
FIG. 16 is a cross-sectional view taken along a line I-I' of FIG. 15.

FIG. 15 is a plan view illustrating a pixel of an image sensor according to some embodiments of the disclosure, and FIG. 16 is a cross-sectional view taken along a line I-I' of FIG. 15. Hereinafter, differences between a pixel PX of the embodiments and the pixel PX mentioned with reference to FIGS. 2 and 3 will be mainly described for the purpose of ease and convenience in explanation.

Referring to FIGS. 15 and 16, the polarizer 180 may include the lower structure 150 including the trenches 130T and the lower patterns 130, and the upper patterns 160 disposed on the lower structure 150. The lower structure 150 may also include the lower insulating patterns 140 disposed in the trenches 130T, respectively, and the passivation layer 142 disposed between the lower insulating patterns 140 and the lower patterns 130. The passivation layer 142 may extend between each of the lower insulating patterns 140 and the substrate 100 and may extend onto top surfaces of the lower patterns 130.

According to the embodiments, the upper patterns 160 may be spaced apart from each other in the first direction D1 and may extend in the second direction D2. Each of the upper patterns 160 may have a line shape extending in the second direction D2. The upper patterns 160 may be aligned on the lower patterns 130 and the lower insulating patterns 140, respectively. Each of the upper patterns 160 may vertically overlap with a corresponding one of the lower patterns 130 and the lower insulating patterns 140. Each of the upper patterns 160 may include the first upper pattern 162 on the lower structure 150, and the second upper pattern 164 between the lower structure 150 and the first upper pattern 162. The second upper pattern 164 may be in direct contact with the passivation layer 142 disposed on a corresponding one of the lower patterns 130 or may be in direct contact with a corresponding one of the lower insulating patterns 140.

Each of the upper patterns 160, the lower patterns 130 and the trenches 130T may have a width in the first direction D1. A first width W1 of each of the upper patterns 160 may be less than a second width W2 of each of the lower patterns 130 and may be less than a third width W3 of each of the trenches 130T. The upper patterns 160 may be spaced apart from each other by a first distance d1 in the first direction D1. A pitch PT1 of the upper patterns 160 may be a sum of the first width W1 of each of the upper patterns 160 and the first distance d1 between the upper patterns 160 (i.e., PT1=W1+d1), and a pitch PT2 of the lower patterns 130 may be a sum of the second width W2 of each of the lower patterns 130 and the third width W3 of each of the trenches 130T (i.e., PT2=W2+W3). The pitch PT1 of the upper patterns 160 may be less than the pitch PT2 of the lower patterns 130 (i.e., PT1<PT2).

Figure 17:
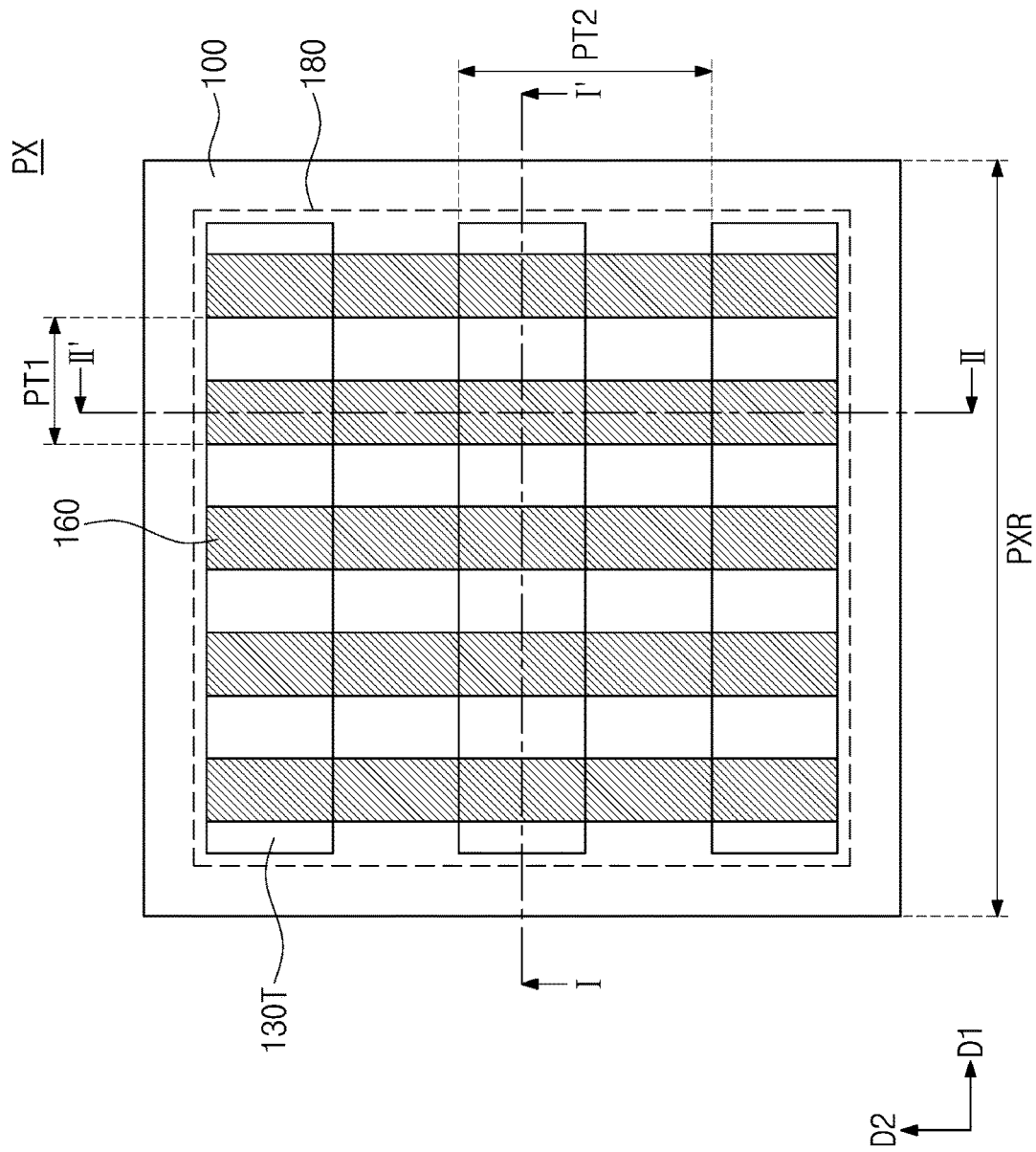
FIG. 17 is a plan view illustrating a pixel of an image sensor according to some embodiments of the disclosure.
Figure 18:
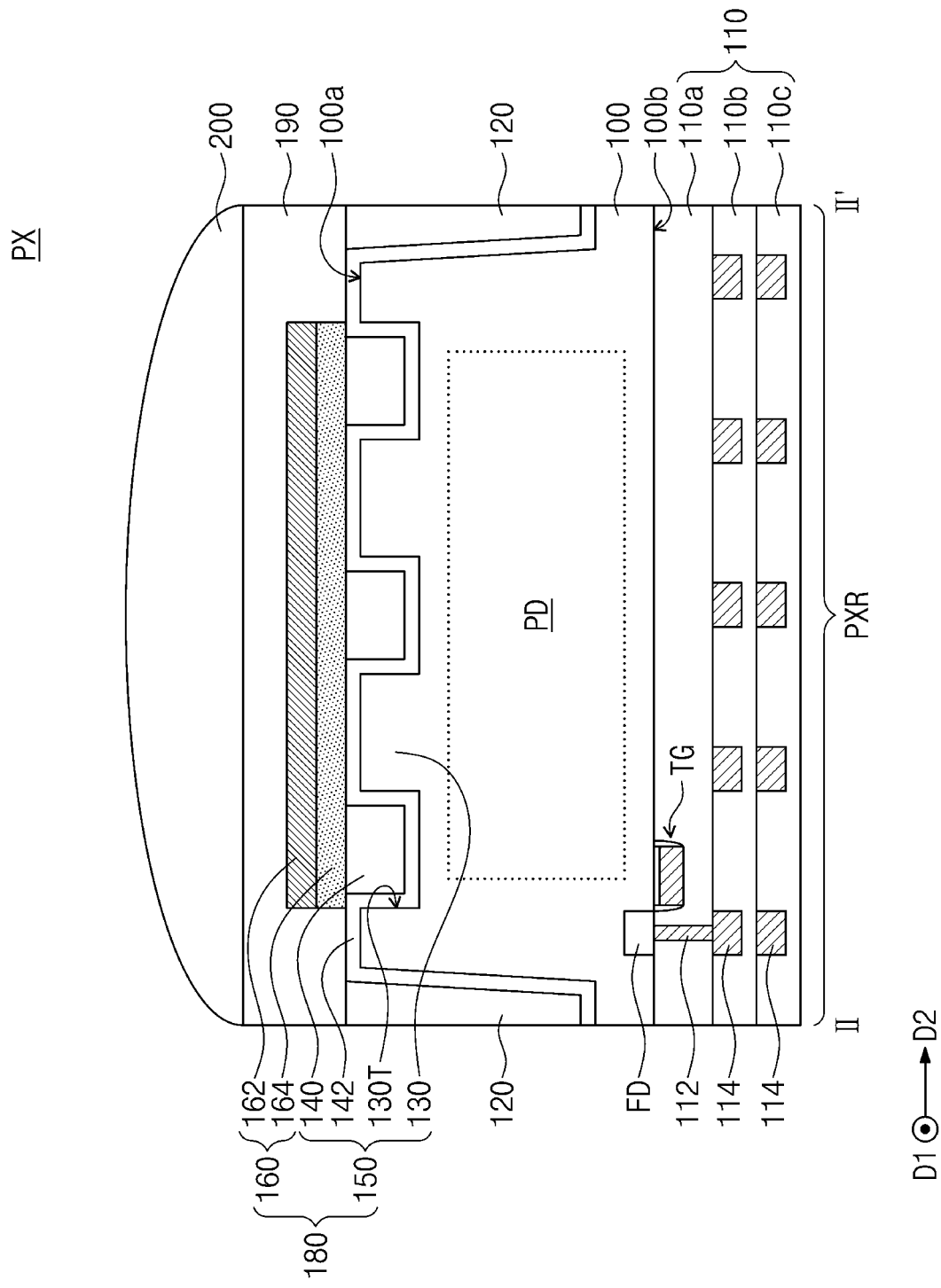
FIG. 18 is a cross-sectional view taken along a line II-II' of FIG. 17.

FIG. 17 is a plan view illustrating a pixel of an image sensor according to some embodiments of the disclosure, and FIG. 18 is a cross-sectional view taken along a line II-II' of FIG. 17. A cross-sectional view shown in FIG. 18 taken along a line I-I' of FIG. 17 is substantially the same as FIG. 13.

Referring to FIGS. 17, 18 and 13, in the embodiments, a pitch PT1 of the upper patterns 160 may be less than a pitch PT2 of the lower patterns 130 (i.e., PT1<PT2). Except for these features, other features and components of a pixel PX of an image sensor according to the embodiments may be substantially the same as corresponding features and components of the pixel PX of the image sensor described with reference to FIGS. 12, 13 and 14.

Figure 19A:
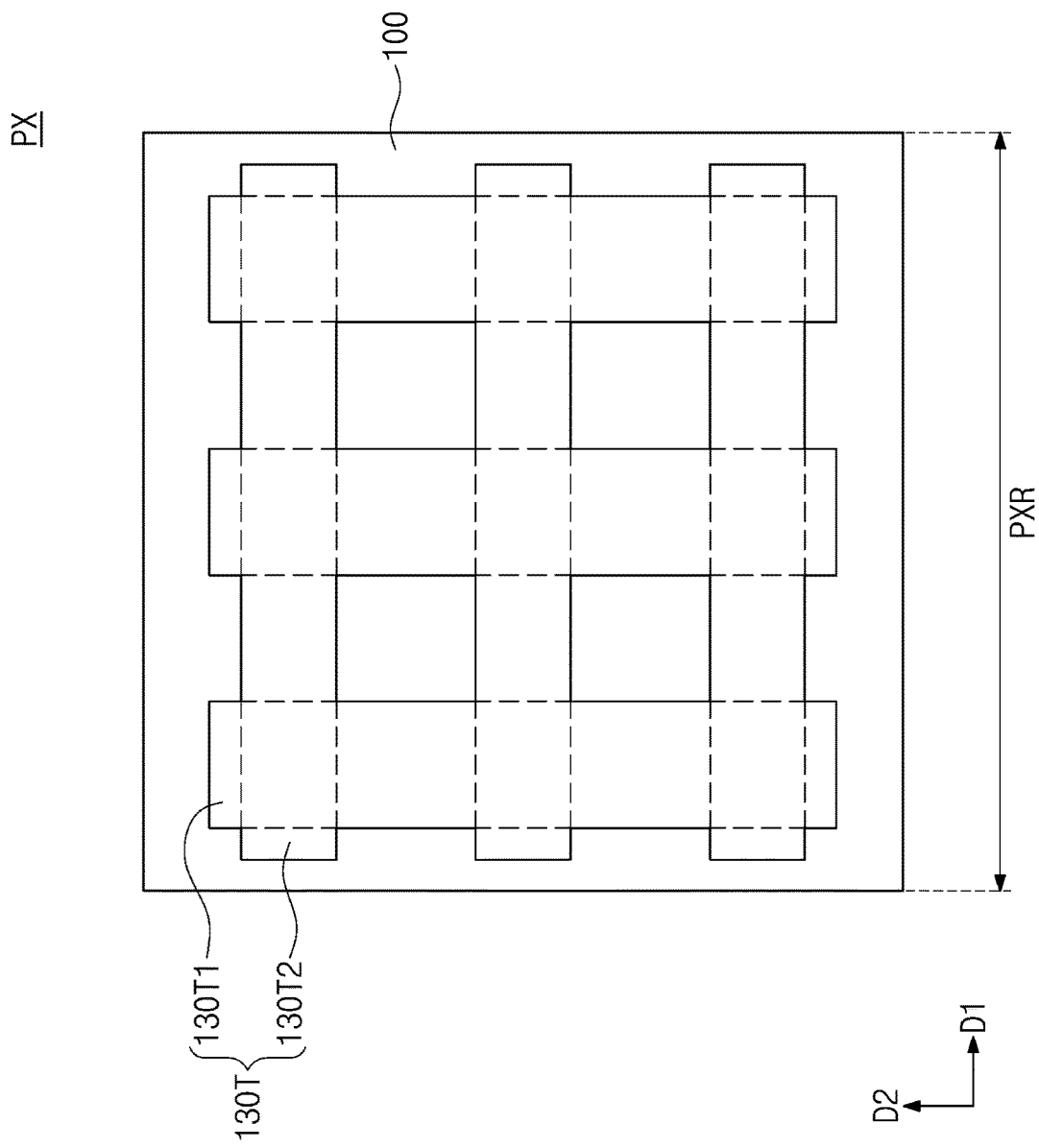
FIGS. 19A and 19B are plan views illustrating portions of pixels of image sensors according to some embodiments of the disclosure.
Figure 19B:
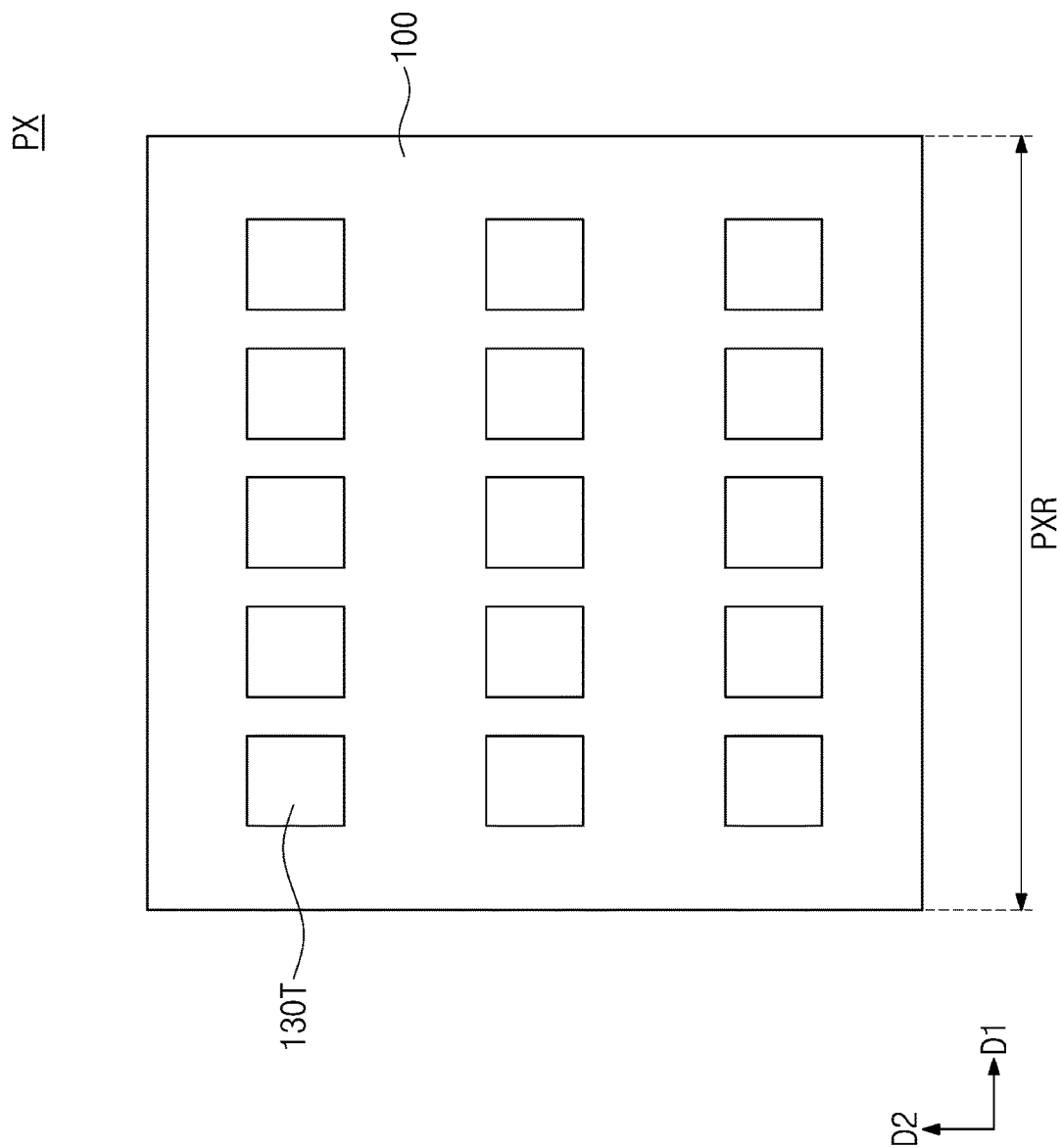

FIGS. 19A and 19B are plan views illustrating portions of pixels of image sensors according to some embodiments of the disclosure.

Referring to FIGS. 19A and 19B, the polarizer 180 may include a lower structure 150 including a plurality of trenches 130T recessed from the first surface 100a of the substrate 100 into the substrate 100, and a plurality of upper patterns 160 disposed on the lower structure 150. For the purpose of ease and convenience in explanation and illustration, the upper patterns 160 are omitted in FIGS. 19A and 19B. In some embodiments, referring to FIG. 19A, the trenches 130T may include first trenches 130T1 and second trenches 130T2 intersecting the first trenches 130T1. The first trenches 130T1 may be spaced apart from each other in the first direction D1 and may extend in the second direction D2. The second trenches 130T2 may be spaced apart from each other in the second direction D2 and may extend in the first direction D1. The first trenches 130T1 may be connected to the second trenches 130T2. The trenches 130T may have a grid structure by the first trenches 130T1 and the second trenches 130T2. In certain embodiments, referring to FIG. 19B, the trenches 130T may be spaced apart from each other in the first direction D1 and the second direction D2, and thus the trenches 130T may have a dot array structure.

Figure 20:
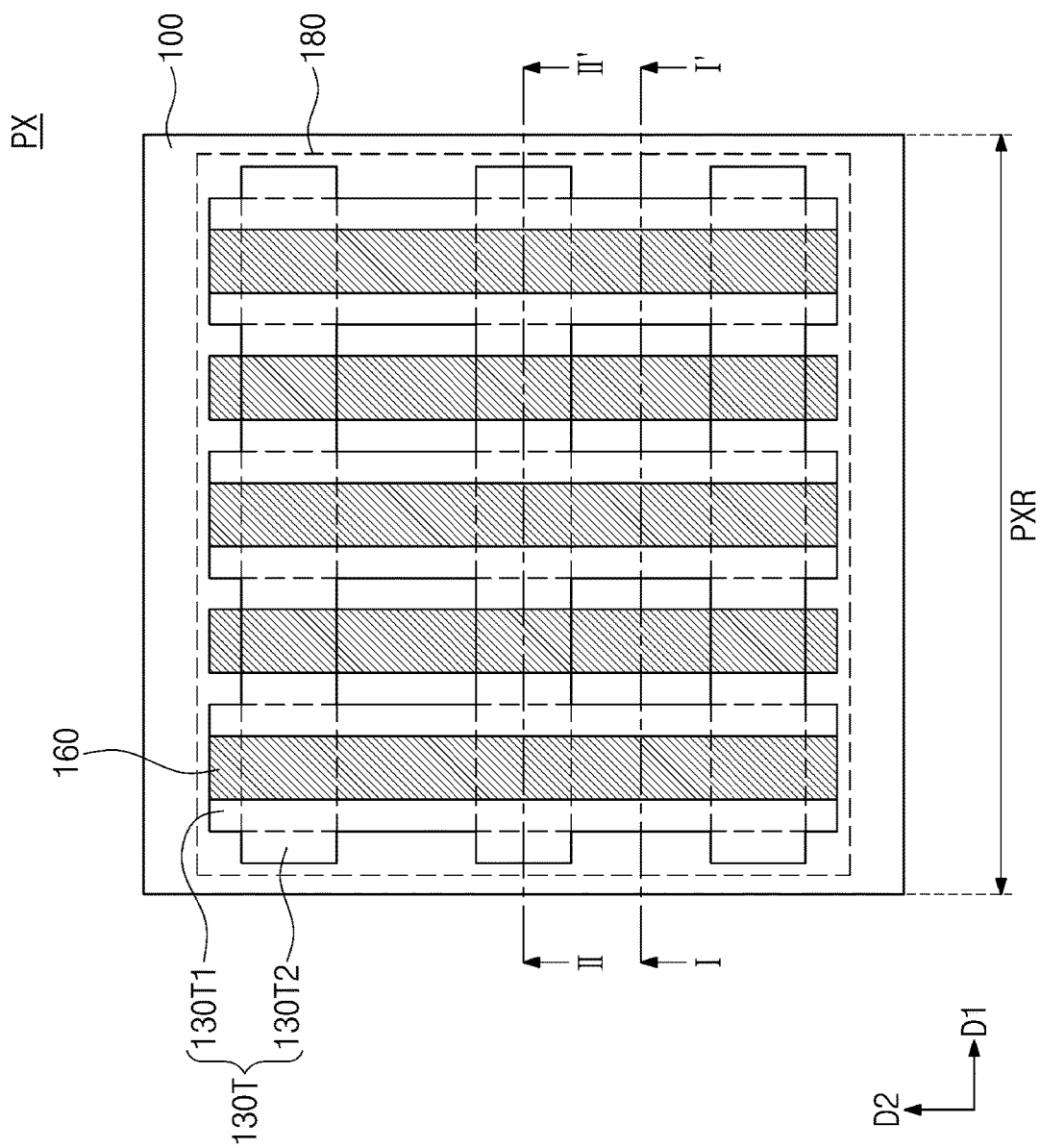
FIG. 20 is a plan view illustrating a pixel of an image sensor according to some embodiments of the disclosure.

FIG. 20 is a plan view illustrating a pixel of an image sensor according to some embodiments of the disclosure. Cross-sectional views taken along lines I-I' and II-II' of FIG. 20 are substantially the same as FIGS. 16 and 13, respectively. Hereinafter, differences between a pixel PX of the embodiments and the pixel PX mentioned with reference to FIGS. 2 and 3 will be mainly described for the purpose of ease and convenience in explanation.

Referring to FIGS. 20, 13 and 16, the polarizer 180 may include the lower structure 150 including the trenches 130T and the lower patterns 130, and the upper patterns 160 disposed on the lower structure 150. The lower structure 150 may also include the lower insulating patterns 140 disposed in the trenches 130T, respectively, and the passivation layer 142 disposed between the lower insulating patterns 140 and the lower patterns 130. The passivation layer 142 may extend between each of the lower insulating patterns 140 and the substrate 100 and may extend onto top surfaces of the lower patterns 130. In the embodiments, the trenches 130T may include the first trenches 130T1 and the second trenches 130T2, described with reference to FIG. 19A. The trenches 130T may have the grid structure by the first trenches 130T1 and the second trenches 130T2.

The upper patterns 160 may be spaced apart from each other in the first direction D1 and may extend in the second direction D2. Each of the upper patterns 160 may have a line shape extending in the second direction D2. In some embodiments, a pitch PT1 of the upper patterns 160 may be less than a pitch PT2 of the lower patterns 130 disposed in the first trenches 130T1.

Figure 21:
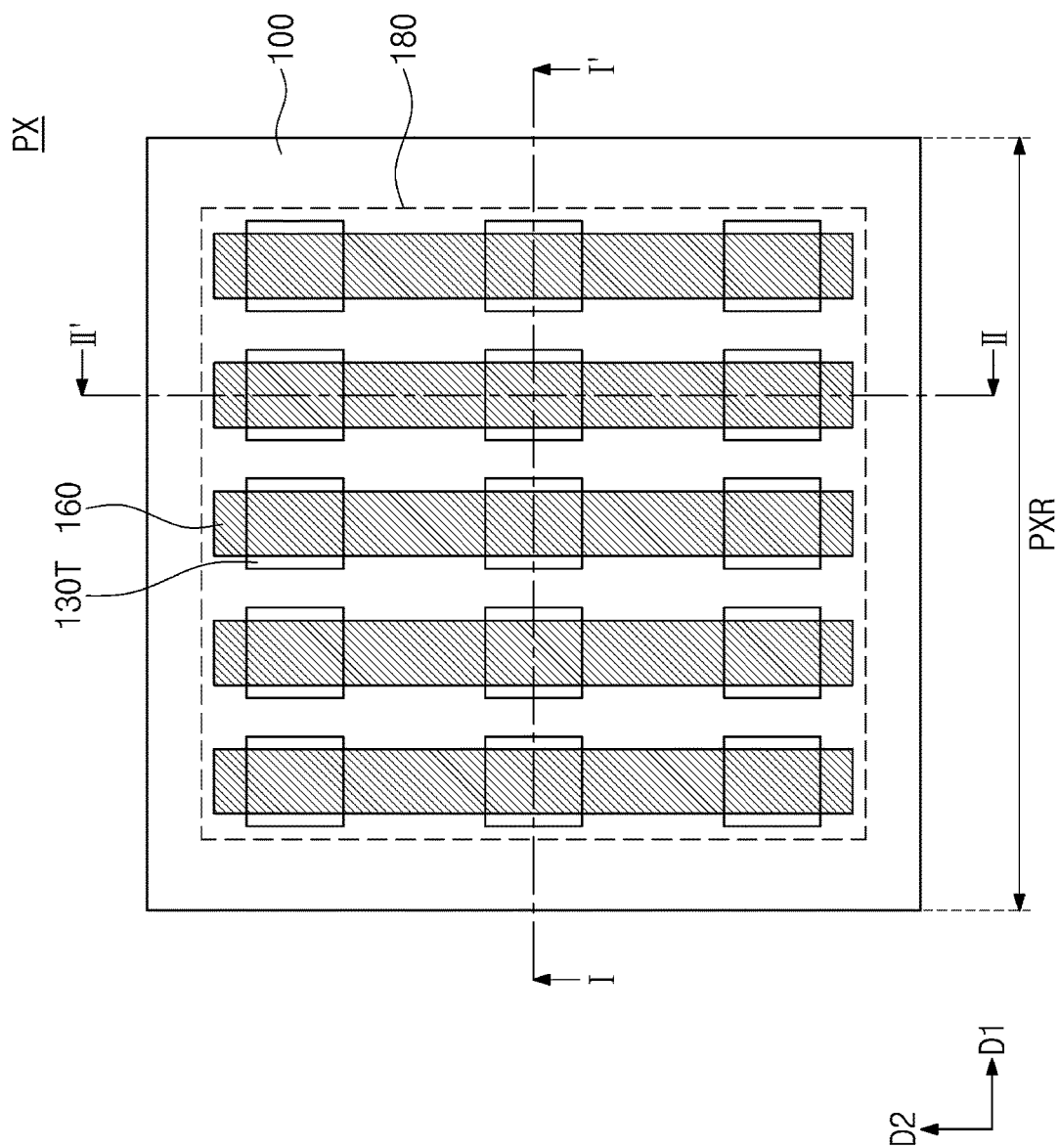
FIG. 21 is a plan view illustrating a pixel of an image sensor according to some embodiments of the disclosure.
Figure 22:
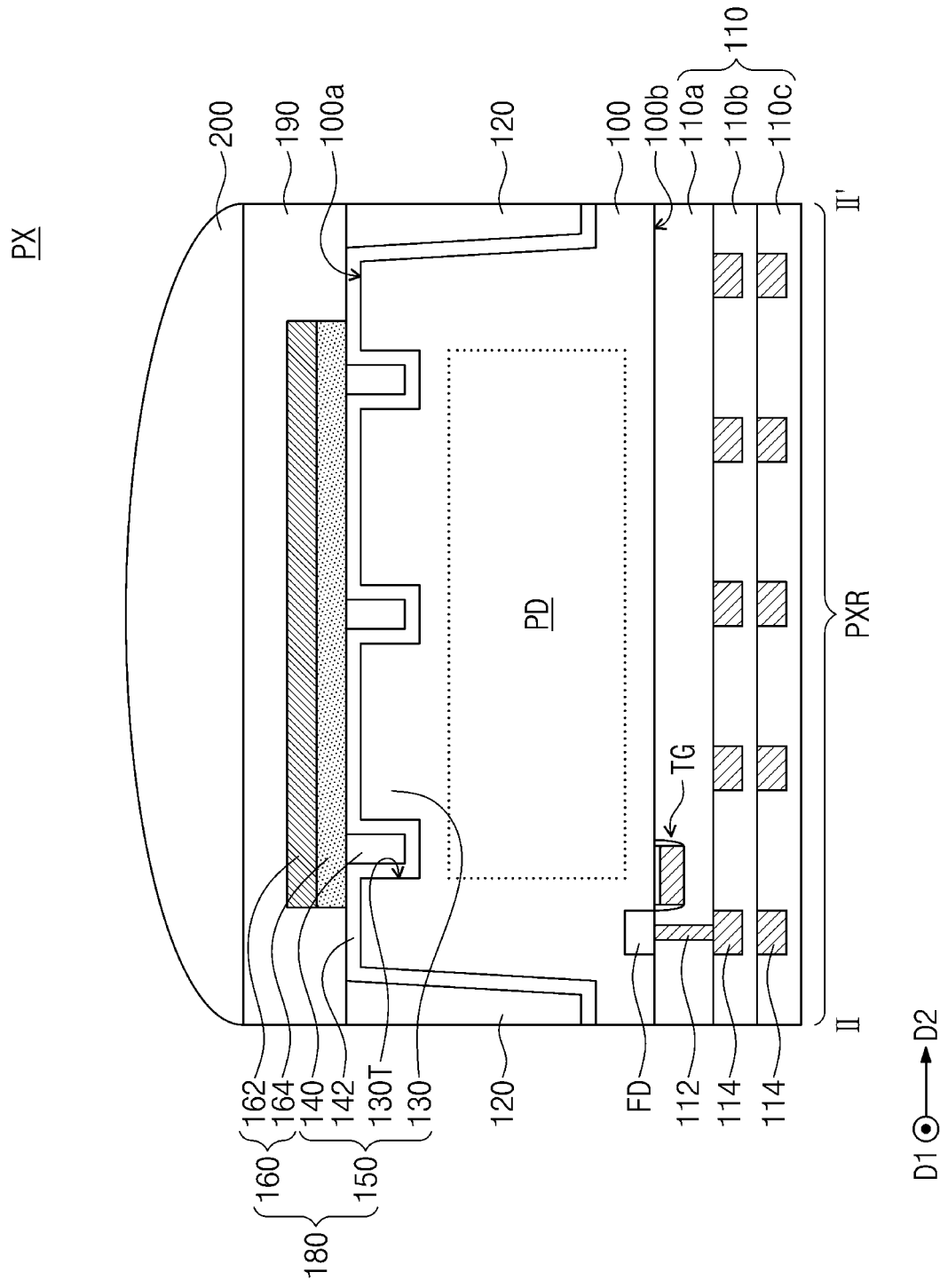
FIG. 22 is a cross-sectional view taken along a line II-II' of FIG. 21.

FIG. 21 is a plan view illustrating a pixel of an image sensor according to some embodiments of the disclosure, and FIG. 22 is a cross-sectional view taken along a line II-II' of FIG. 21. A cross-sectional view taken along a line I-I' of FIG. 21 is substantially the same as FIG. 11. Hereinafter, differences between a pixel PX of the embodiments and the pixel PX mentioned with reference to FIGS. 2 and 3 will be mainly described for the purpose of ease and convenience in explanation.

Referring to FIGS. 21, 22 and 11, the polarizer 180 may include the lower structure 150 including the trenches 130T and the lower patterns 130, and the upper patterns 160 disposed on the lower structure 150. The lower structure 150 may also include the lower insulating patterns 140 disposed in the trenches 130T, respectively, and the passivation layer 142 disposed between the lower insulating patterns 140 and the lower patterns 130. The passivation layer 142 may extend between each of the lower insulating patterns 140 and the substrate 100 and may extend onto top surfaces of the lower patterns 130. In the embodiments, the trenches 130T may have the dot array structure described with reference to FIG. 19B. In this case, the lower insulating patterns 140 may be two-dimensionally arranged in the first direction D1 and the second direction D2.

The upper patterns 160 may be spaced apart from each other in the first direction D1 and may extend in the second direction D2. Each of the upper patterns 160 may have a line shape extending in the second direction D2. In some embodiments, the upper patterns 160 may be aligned on the lower insulating patterns 140 spaced apart from each other in the first direction D1, respectively. Each of the upper patterns 160 may cover the lower insulating patterns 140 spaced apart from each other in the second direction D2.

Figure 23:
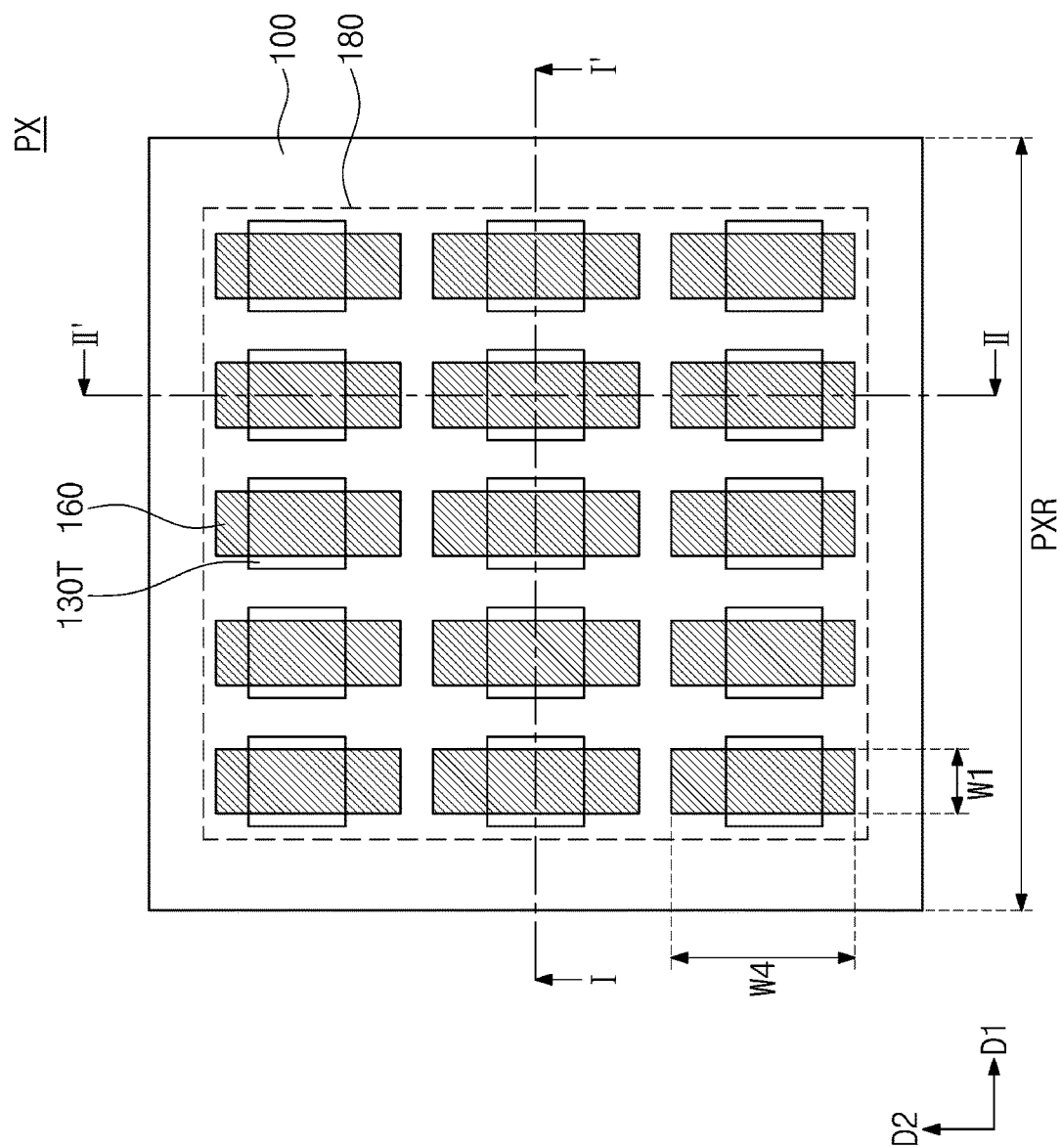
FIG. 23 is a plan view illustrating a pixel of an image sensor according to some embodiments of the disclosure.
Figure 24:
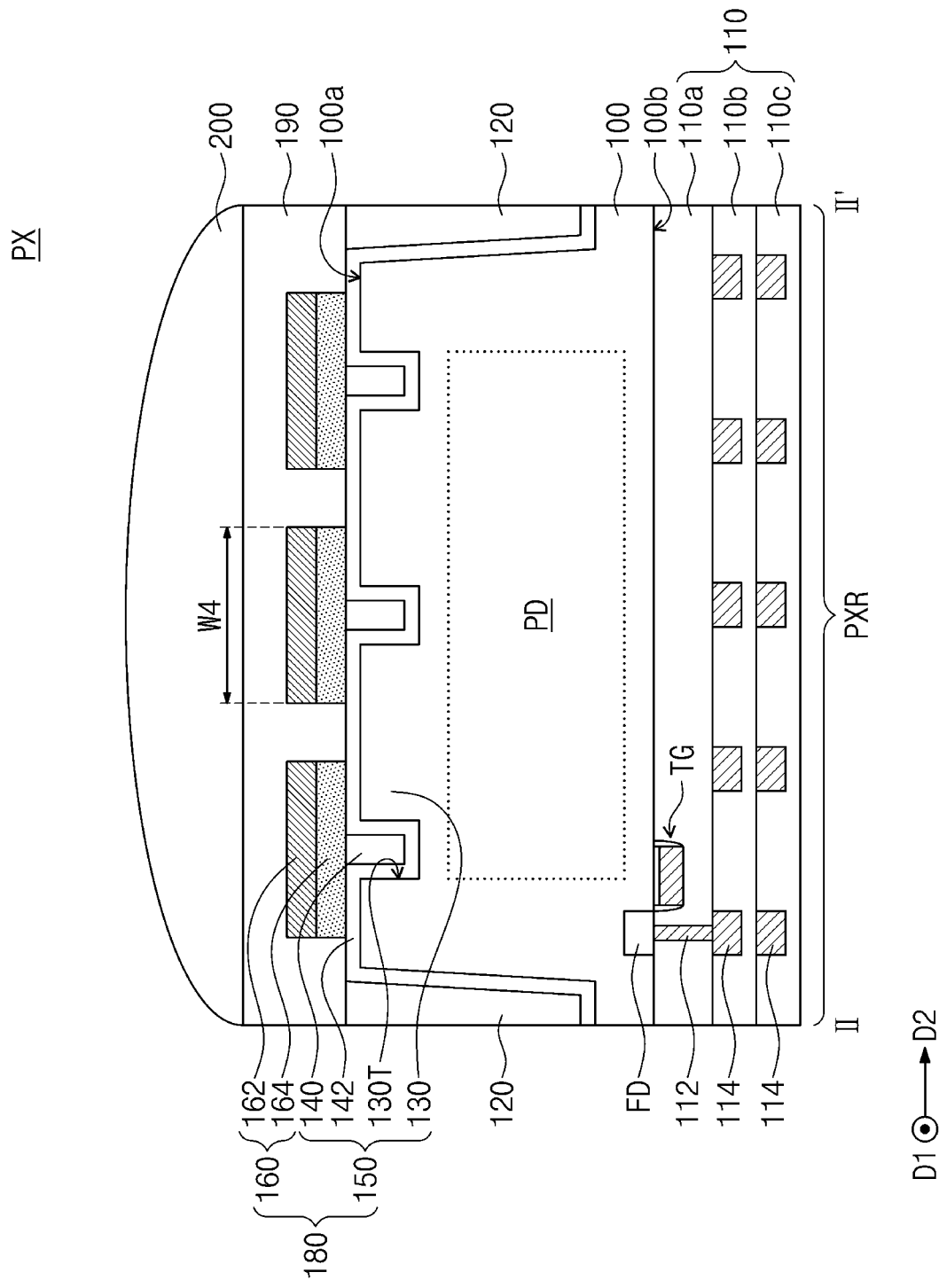
FIG. 24 is a cross-sectional view taken along a line II-II' of FIG. 23.

FIG. 23 is a plan view illustrating a pixel of an image sensor according to some embodiments of the disclosure, and FIG. 24 is a cross-sectional view taken along a line II-II' of FIG. 23. A cross-sectional view taken along a line I-I' of FIG. 23 is substantially the same as FIG. 11. Hereinafter, differences between a pixel PX of the embodiments and the pixel PX mentioned with reference to FIGS. 2 and 3 will be mainly described for the purpose of ease and convenience in explanation.

Referring to FIGS. 23, 24 and 11, the polarizer 180 may include the lower structure 150 including the trenches 130T and the lower patterns 130, and upper patterns 160 disposed on the lower structure 150. The lower structure 150 may also include the lower insulating patterns 140 disposed in the trenches 130T, respectively, and the passivation layer 142 disposed between the lower insulating patterns 140 and the lower patterns 130. The passivation layer 142 may extend between each of the lower insulating patterns 140 and the substrate 100 and may extend onto the top surfaces of the lower patterns 130. In the embodiments, the trenches 130T may have the dot array structure described with reference to FIG. 19B. In this case, the lower insulating patterns 140 may be two-dimensionally arranged in the first direction D1 and the second direction D2.

In some embodiments, the upper patterns 160 may be two-dimensionally arranged in the first direction D1 and the second direction D2. The upper patterns 160 may be aligned on the lower insulating patterns 140, respectively. Each of the upper patterns 160 may have a bar shape extending in the second direction D2. For example, each of the upper patterns 160 may have a width W1 in the first direction D1 and a width W4 in the second direction D2, and the width W4 in the second direction D2 may be greater than the width W1 in the first direction D1.

Figure 25:
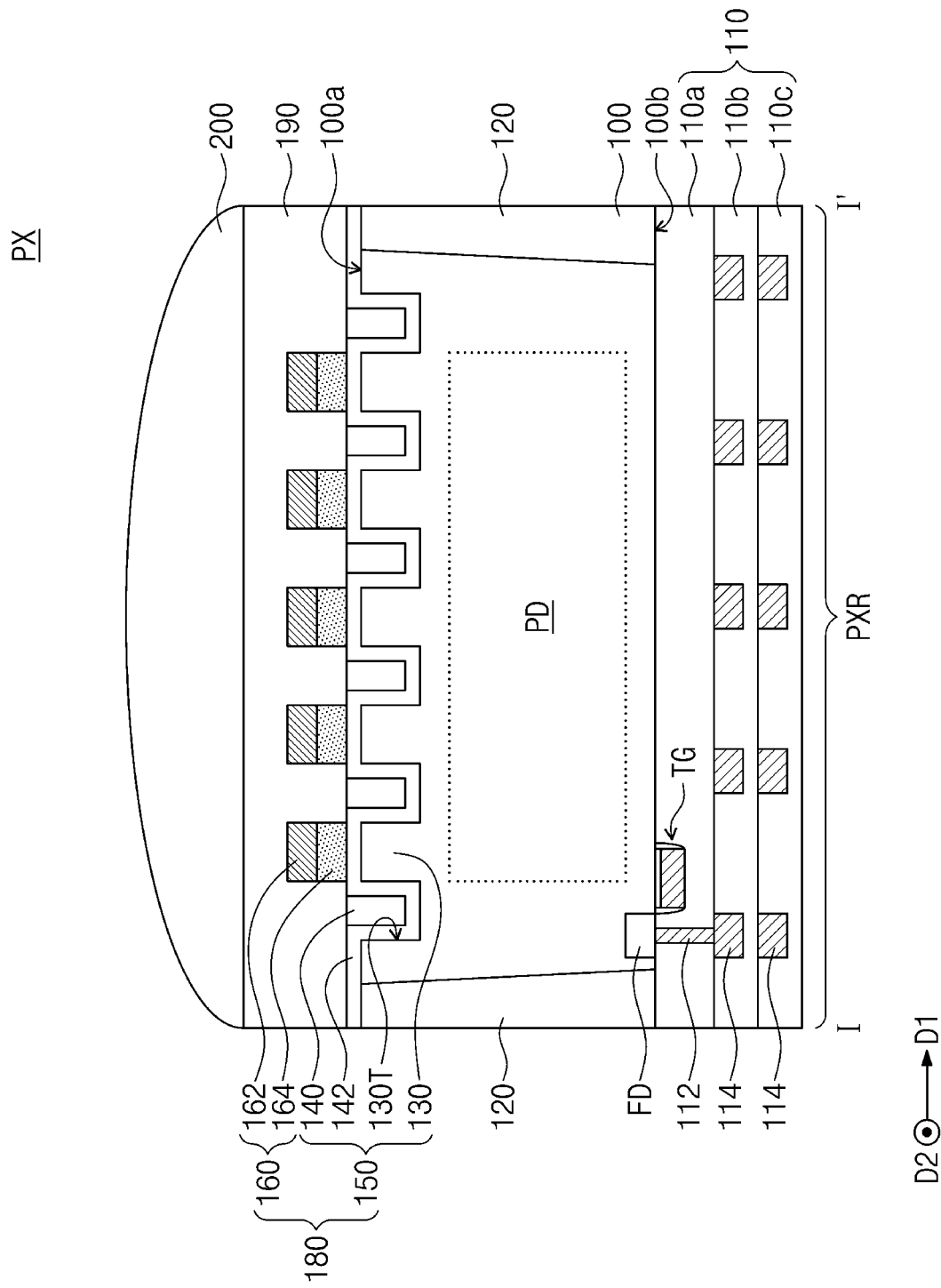
FIGS. 25 and 26 are cross-sectional views corresponding to the line I-I' of FIG. 2 to illustrate pixels of image sensors according to some embodiments of the disclosure.

FIG. 25 is a cross-sectional view corresponding to the line I-I' of FIG. 2 to illustrate a pixel of an image sensor according to some embodiments of the disclosure. Hereinafter, differences between a pixel PX of the embodiments and the pixel PX mentioned with reference to FIGS. 2 and 3 will be mainly described for the purpose of ease and convenience in explanation.

Referring to FIGS. 2 and 25, each of the device isolation patterns 120 may penetrate the substrate 100. For example, each of the device isolation patterns 120 may extend from the second surface 100b of the substrate 100 into the substrate 100, and the first surface 100a of the substrate 100 may expose one surface of each of the device isolation patterns 120.

The polarizer 180 may include the lower structure 150 including the trenches 130T recessed from the first surface 100a of the substrate 100 into the substrate 100, and the upper patterns 160 disposed on the lower structure 150. The lower structure 150 may also include the lower patterns 130 defined by the trenches 130T, the lower insulating patterns 140 disposed in the trenches 130T, respectively, and the passivation layer 142 disposed between the lower insulating patterns 140 and the lower patterns 130. The passivation layer 142 may extend between each of the lower insulating patterns 140 and the substrate 100 and may extend onto the top surfaces of the lower patterns 130. In the embodiments, the passivation layer 142 may cover the first surface 100a of the substrate 100 and may extend onto the exposed surface of each of the device isolation patterns 120.

Figure 26:
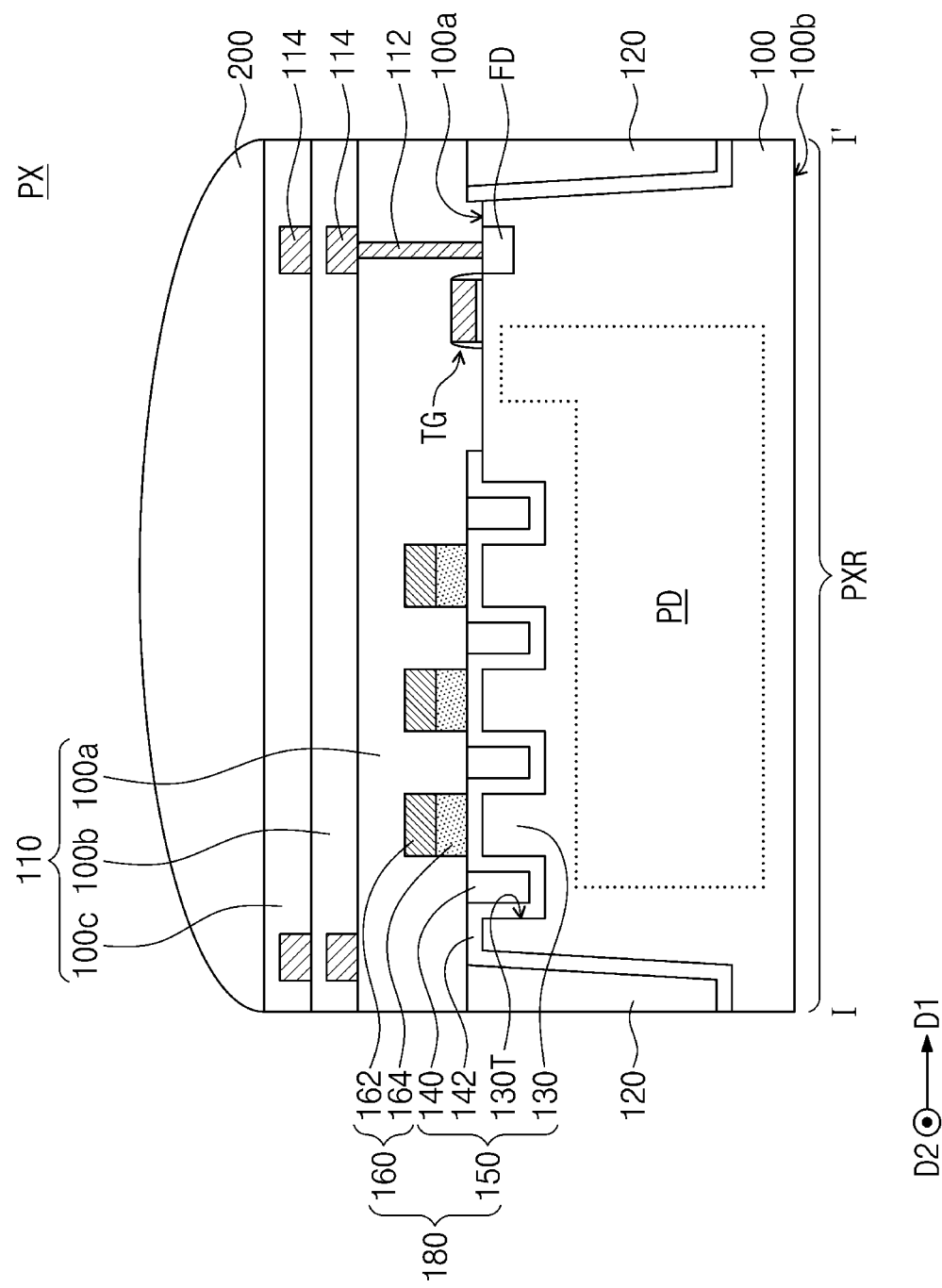

FIG. 26 is a cross-sectional view corresponding to the line I-I' of FIG. 2 to illustrate a pixel of an image sensor according to some embodiments of the disclosure. Hereinafter, differences between a pixel PX of the embodiments and the pixel PX mentioned with reference to FIGS. 2 and 3 will be mainly described for the purpose of ease and convenience in explanation.

Referring to FIGS. 2 and 26, the floating diffusion region FD may be disposed in the pixel region PXR. The floating diffusion region FD may be disposed adjacent to the first surface 100a of the substrate 100. The transfer gate TG may be disposed on the first surface 100a of the substrate 100. The transfer gate TG may be disposed on the pixel region PXR and may be disposed adjacent to the floating diffusion region FD.

The polarizer 180 may be disposed on the pixel region PXR and may be disposed adjacent to the first surface 100a of the substrate 100. The polarizer 180 may include the lower structure 150 including the trenches 130T recessed from the first surface 100a of the substrate 100 into the substrate 100, and the upper patterns 160 disposed on the lower structure 150. The lower structure 150 may also include the lower patterns 130 defined by the trenches 130T, the lower insulating patterns 140 disposed in the trenches 130T, respectively, and the passivation layer 142 disposed between the lower insulating patterns 140 and the lower patterns 130. The passivation layer 142 may extend between each of the lower insulating patterns 140 and the substrate 100 and may extend onto the top surfaces of the lower patterns 130. The passivation layer 142 may also extend between each of the device isolation patterns 120 and the substrate 100. In the embodiments, the passivation layer 142 may expose a portion of the first surface 100a of the substrate 100, on which the transfer gate TG and the floating diffusion region FD are formed.

The interconnection structure 110 may be disposed on the first surface 100a of the substrate 100. The interconnection structure 110 may include a first interlayer insulating layer 110a, a second interlayer insulating layer 110b and a third interlayer insulating layer 110c, which are sequentially stacked on the first surface 100a of the substrate 100. The first interlayer insulating layer 110a may be disposed on the first surface 100a of the substrate 100 and may cover the polarizer 180 and the transfer gate TG. The first interlayer insulating layer 110a may extend between the upper patterns 160 of the polarizer 180 to cover the lower structure 150. The interconnection structure 110 may further include a via 112 penetrating the first interlayer insulating layer 110a, and interconnection lines 114 provided in the second and third interlayer insulating layers 110b and 110c. The via 112 may be connected to the floating diffusion region FD and may be connected to a corresponding one of the interconnection lines 114.

The micro lens 200 may be disposed on the interconnection structure 110. The interconnection structure 110 may be disposed between the first surface 100a of the substrate 100 and the micro lens 200.

Figure 27:
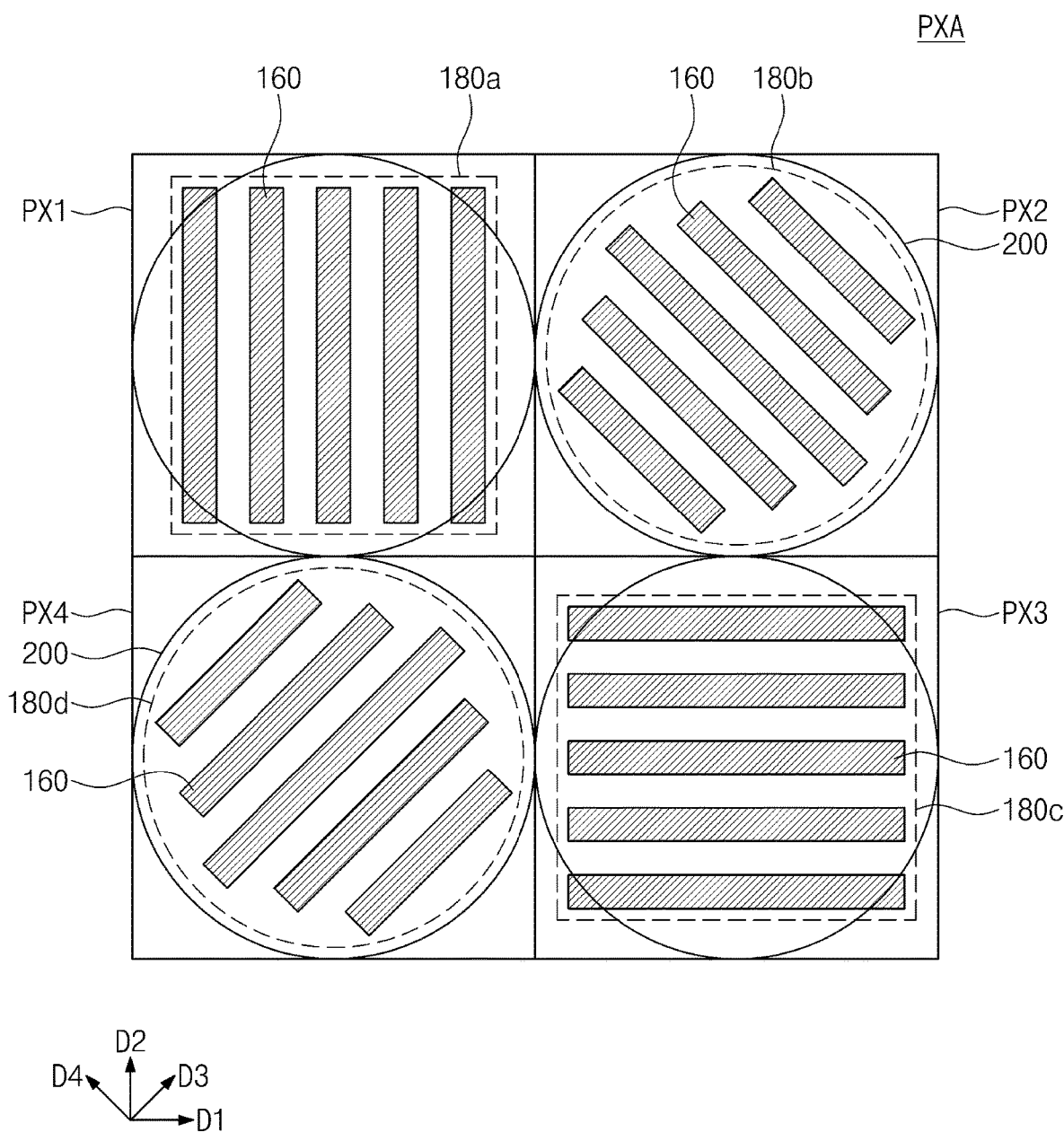
FIGS. 27 to 30 are plan views illustrating pixel arrays of image sensors according to some embodiments of the disclosure.

FIG. 27 is a plan view illustrating a pixel array of an image sensor according to some embodiments of the disclosure.

Referring to FIG. 27, a pixel array PXA may include a plurality of unit pixels PX1, PX2, PX3 and PX4 two-dimensionally arranged in a first direction D1 and a second direction D2 intersecting the first direction D1. For example, the plurality of unit pixels PX1, PX2, PX3 and PX4 may include first to fourth pixels PX1, PX2, PX3 and PX4, and the first to fourth pixels PX1, PX2, PX3 and PX4 may be sequentially arranged in a clockwise direction.

The first to fourth pixels PX1, PX2, PX3 and PX4 may include first to fourth polarizers 180a, 180b, 180c and 180d, respectively. The first to fourth polarizers 180a, 180b, 180c and 180d may have different polarization axes from each other.

For example, each of the first to fourth polarizers 180a, 180b, 180c and 180d may include upper patterns 160. The upper patterns 160 of the first polarizer 180a may be spaced apart from each other in the first direction D1 and may extend in the second direction D2. The polarization axis of the first polarizer 180a may be perpendicular to the extending direction (e.g., the second direction D2) of the upper patterns 160 of the first polarizer 180a. For example, the polarization axis of the first polarizer 180a may be parallel to the first direction D1. The upper patterns 160 of the second polarizer 180b may be spaced apart from each other in a third direction D3 intersecting the first and second directions D1 and D2 and may extend in a fourth direction D4 intersecting the first to third directions D1, D2 and D3. The polarization axis of the second polarizer 180b may be perpendicular to the extending direction (e.g., the fourth direction D4) of the upper patterns 160 of the second polarizer 180b. For example, the polarization axis of the second polarizer 180b may be parallel to the third direction D3. The upper patterns 160 of the third polarizer 180c may be spaced apart from each other in the second direction D2 and may extend in the first direction D1. The polarization axis of the third polarizer 180c may be perpendicular to the extending direction (e.g., the first direction D1) of the upper patterns 160 of the third polarizer 180c. For example, the polarization axis of the third polarizer 180c may be parallel to the second direction D2. The upper patterns 160 of the fourth polarizer 180d may be spaced apart from each other in the fourth direction D4 and may extend in the third direction D3. The polarization axis of the fourth polarizer 180d may be perpendicular to the extending direction (e.g., the third direction D3) of the upper patterns 160 of the fourth polarizer 180d. For example, the polarization axis of the fourth polarizer 180d may be parallel to the fourth direction D4.

Except for the arrangement of the upper patterns 160, other features and components of each of the first to fourth polarizers 180a, 180b, 180c and 180d may be substantially the same as corresponding features and components of one of the polarizers 180 described with reference to FIGS. 2 to 26. Light incident on each of the first to fourth pixels PX1, PX2, PX3 and PX4 may be polarized by each of the first to fourth polarizers 180a, 180b, 180c and 180d. Each of the first to fourth polarizers 180a, 180b, 180c and 180d may selectively transmit only light of a component parallel to its polarization axis. Since the first to fourth polarizers 180a, 180b, 180c and 180d are configured to have different polarization axes, polarization directions of lights incident on the first to fourth pixels PX1, PX2, PX3 and PX4 may be different from each other. In this case, a polarization state of light incident on the pixel array PXA may be sensed from relation between signals detected from the first to fourth pixels PX1, PX2, PX3 and PX4.

Micro lenses 200 may be disposed on the first to fourth pixels PX1, PX2, PX3 and PX4, respectively. Except that the first to fourth pixels PX1, PX2, PX3 and PX4 include the first to fourth polarizers 180a, 180b, 180c and 180d, respectively, other features and components of each of the first to fourth pixels PX1, PX2, PX3 and PX4 may be substantially the same as corresponding features and components of one of the pixels PX described with reference to FIGS. 2 to 26.

Figure 28:
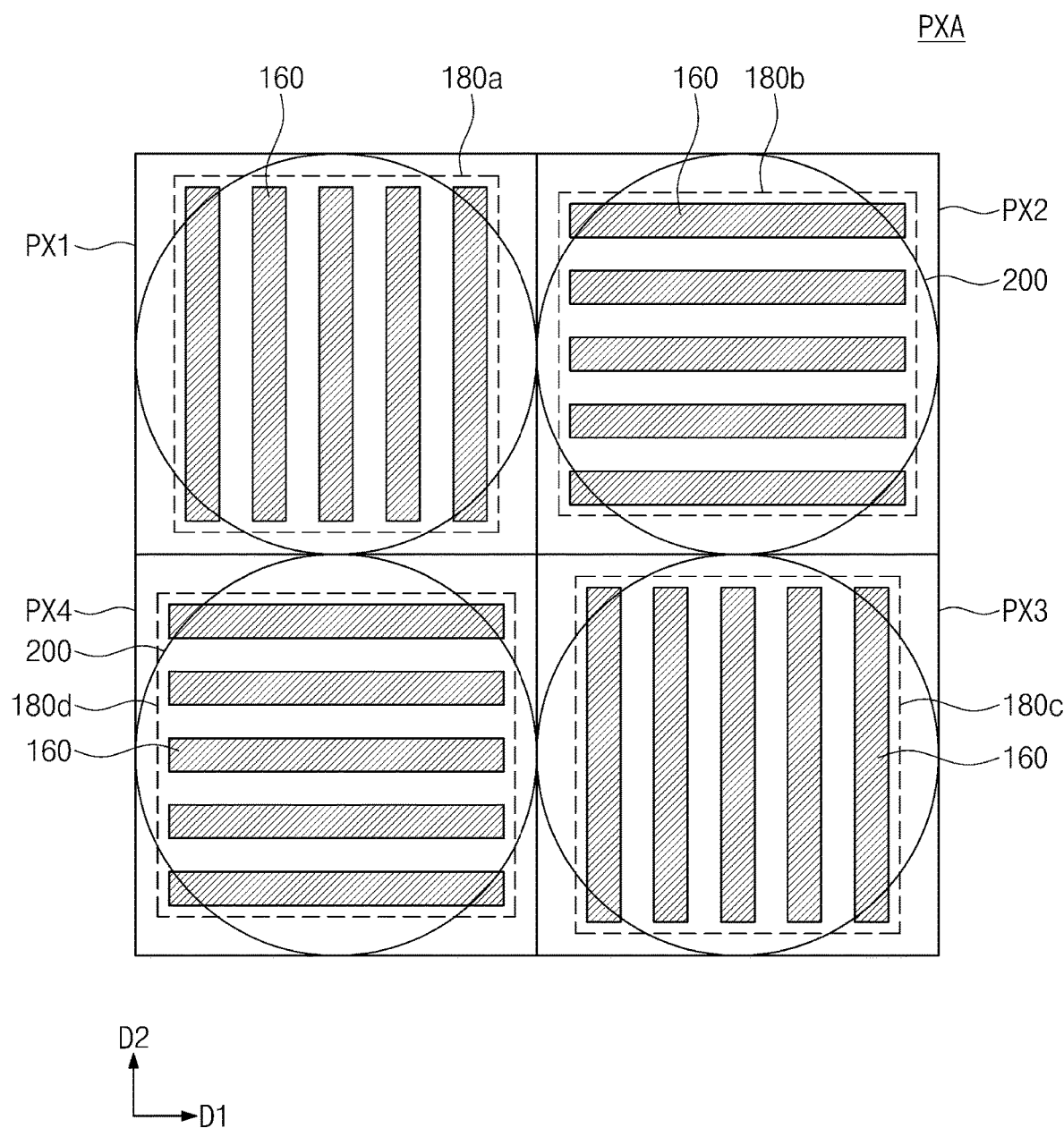

FIG. 28 is a plan view illustrating a pixel array of an image sensor according to some embodiments of the disclosure. Hereinafter, differences between the embodiments and the embodiments of FIG. 27 will be mainly described for the purpose of ease and convenience in explanation.

Referring to FIG. 28, the first to fourth pixels PX1, PX2, PX3 and PX4 may include first to fourth polarizers 180a, 180b, 180c and 180d, respectively. Some of the first to fourth polarizers 180a, 180b, 180c and 180d may have different polarization axes, and others of the first to fourth polarizers 180a, 180b, 180c and 180d may have the same polarization axis.

For example, each of the first to fourth polarizers 180a, 180b, 180c and 180d may include upper patterns 160. The upper patterns 160 of the first polarizer 180a may be spaced apart from each other in the first direction D1 and may extend in the second direction D2. The polarization axis of the first polarizer 180a may be perpendicular to the extending direction (e.g., the second direction D2) of the upper patterns 160 of the first polarizer 180a. For example, the polarization axis of the first polarizer 180a may be parallel to the first direction D1. The upper patterns 160 of the second polarizer 180b may be spaced apart from each other in the second direction D2 and may extend in the first direction D1. The polarization axis of the second polarizer 180b may be perpendicular to the extending direction (e.g., the first direction D1) of the upper patterns 160 of the second polarizer 180b. For example, the polarization axis of the second polarizer 180b may be parallel to the second direction D2. In some embodiments, the third polarizer 180c may be substantially the same as the first polarizer 180a, and the fourth polarizer 180d may be substantially the same as the second polarizer 180b. The polarization axes of the first and third polarizers 180a and 180c may be parallel to the first direction D1, and the polarization axes of the second and fourth polarizers 180b and 180d may be parallel to the second direction D2.

Figure 29:
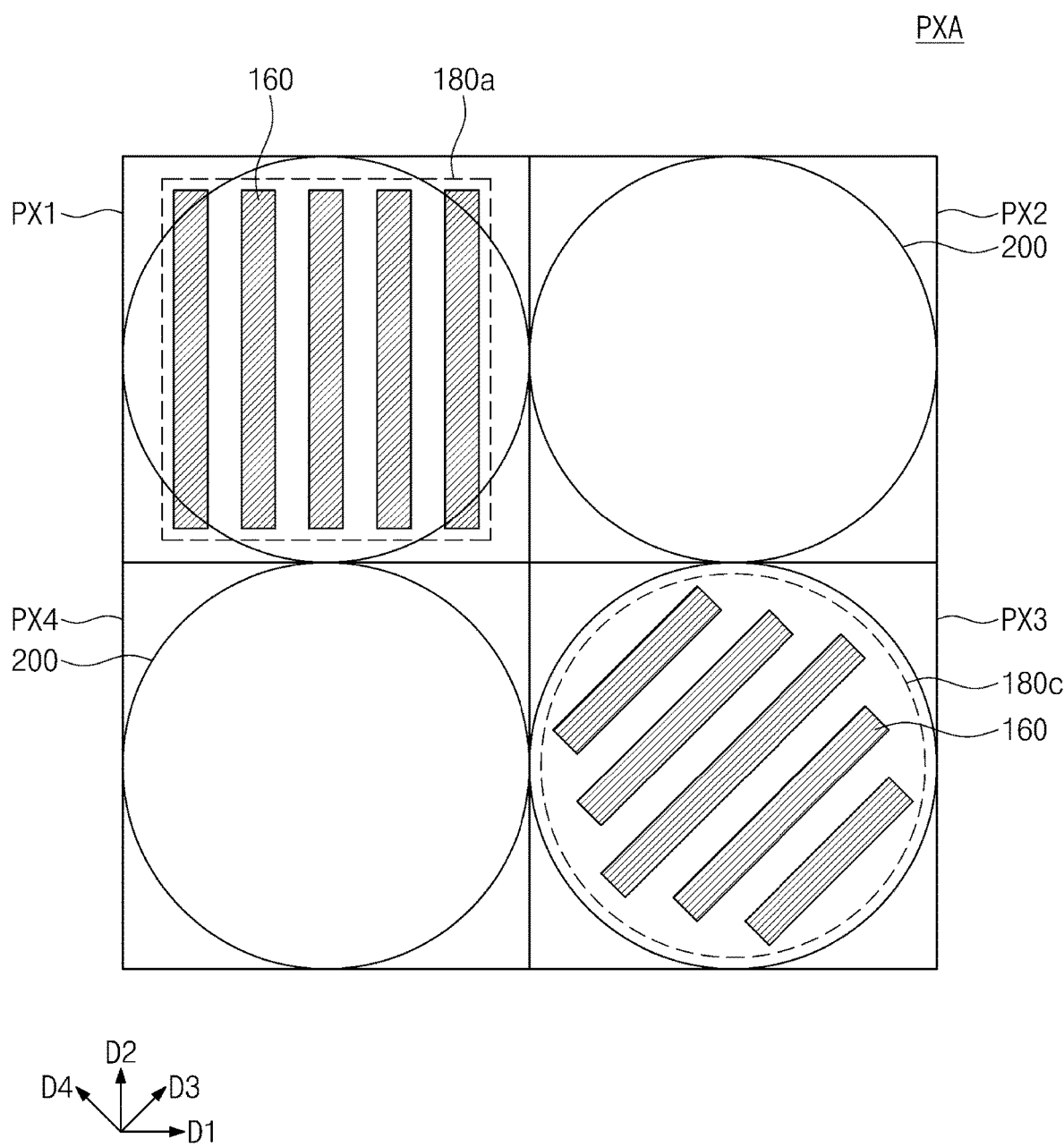

FIG. 29 is a plan view illustrating a pixel array of an image sensor according to some embodiments of the disclosure. Hereinafter, differences between the embodiments and the embodiments of FIG. 27 will be mainly described for the purpose of ease and convenience in explanation.

Referring to FIG. 29, some of the first to fourth pixels PX1, PX2, PX3 and PX4 may include polarizers 180a and 180c, and others of the first to fourth pixels PX1, PX2, PX3 and PX4 may not include polarizers. For example, the first pixel PX1 and the third pixel PX3 may include a first polarizer 180a and a third polarizer 180c, respectively, and the second and fourth pixels PX2 and PX4 may not include a polarizer. The first and third polarizers 180a and 180c may have different polarization axes.

For example, each of the first and third polarizers 180a and 180c may include upper patterns 160. The upper patterns 160 of the first polarizer 180a may be spaced apart from each other in the first direction D1 and may extend in the second direction D2. The polarization axis of the first polarizer 180a may be perpendicular to the extending direction (e.g., the second direction D2) of the upper patterns 160 of the first polarizer 180a. For example, the polarization axis of the first polarizer 180a may be parallel to the first direction D1. The upper patterns 160 of the third polarizer 180c may be spaced apart from each other in the fourth direction D4 and may extend in the third direction D3. The polarization axis of the third polarizer 180c may be perpendicular to the extending direction (e.g., the third direction D3) of the upper patterns 160 of the third polarizer 180c. For example, the polarization axis of the third polarizer 180c may be parallel to the fourth direction D4.

Figure 30:
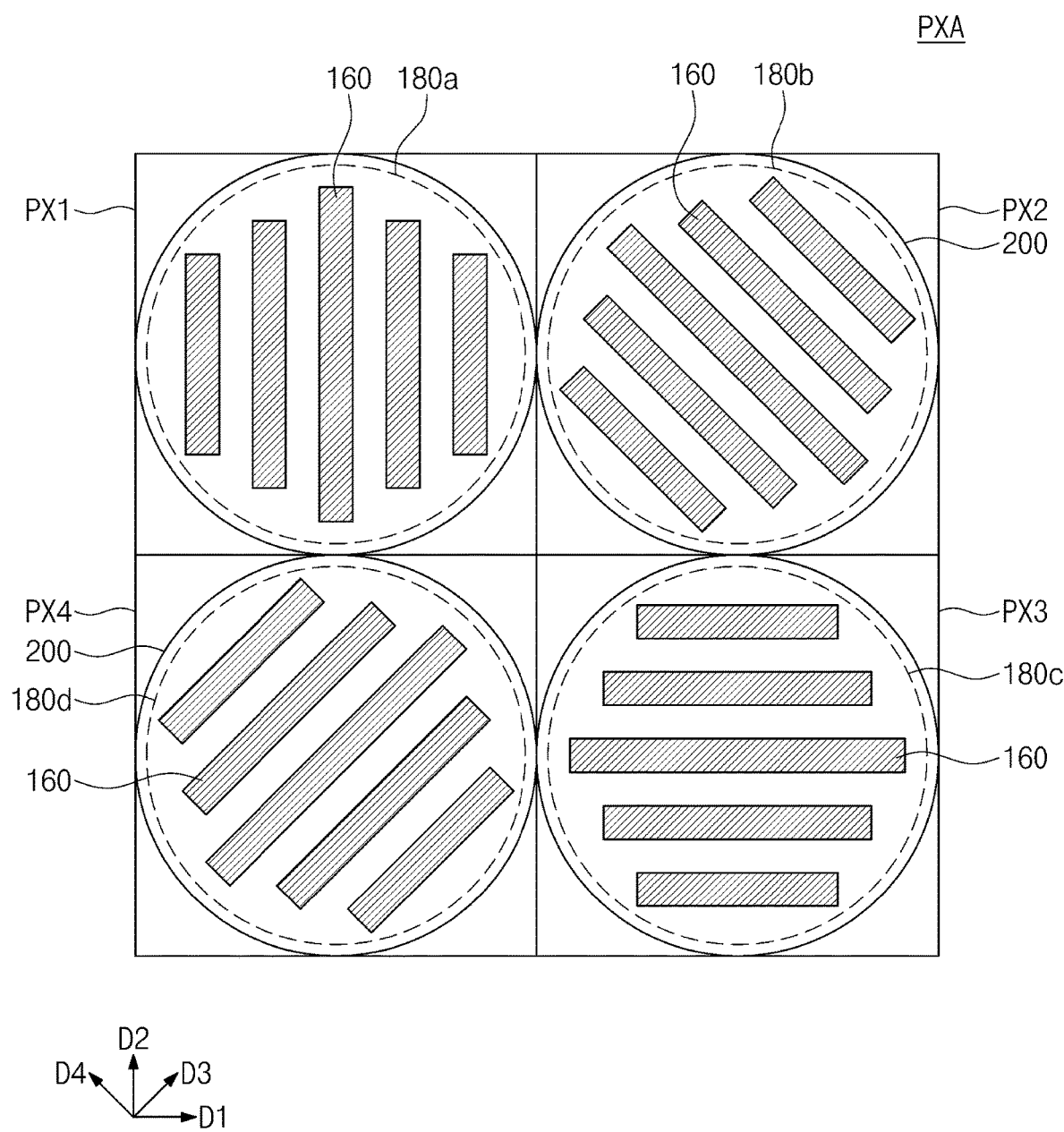

FIG. 30 is a plan view illustrating a pixel array of an image sensor according to some embodiments of the disclosure.

Referring to FIG. 30, in the embodiments, shapes of the upper patterns 160 of the first and third polarizers 180a and 180c may be substantially the same as shapes of the upper patterns 160 of the second and fourth polarizers 180b and 180d. Except for these features, other features and components of a pixel array PXA according to the embodiments may be substantially the same as corresponding features and components of the pixel array PXA of the image sensor described with reference to FIG. 27.

Figure 31:
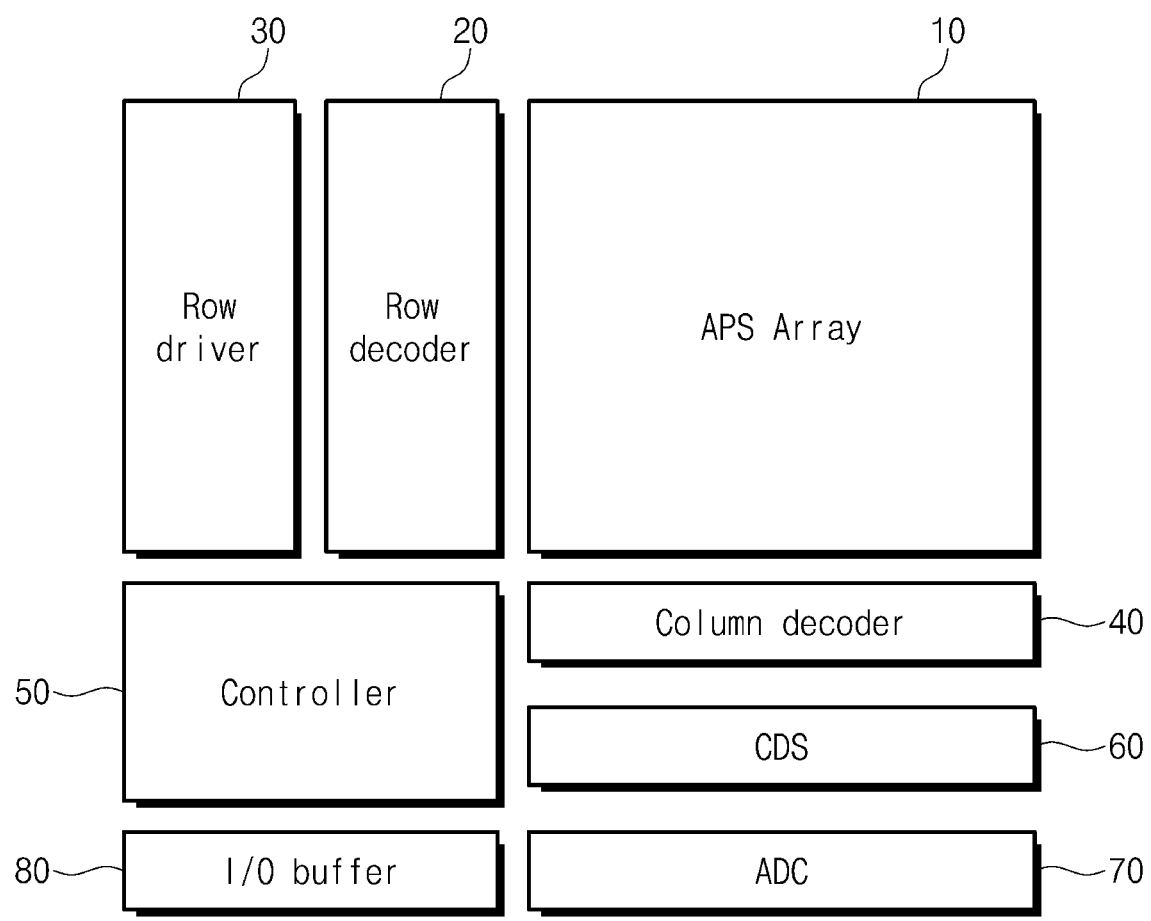
FIG. 31 is a schematic block diagram illustrating an image sensor according to some embodiments of the disclosure.

FIG. 31 is a schematic block diagram illustrating an image sensor according to some embodiments of the disclosure.

Referring to FIG. 31, an image sensor may include an active pixel sensor (APS) array 10, a row decoder 20, a row driver 30, a column decoder 40, a controller 50, a correlated double sampler (CDS) 60, an analog-to-digital converter (ADC) 70, and an input/output (I/O) buffer 80.

The active pixel sensor array 10 may include a plurality of unit pixels two-dimensionally arranged and may convert optical signals into electrical signals. The active pixel sensor array 10 may include the pixels PX according to the embodiments of the disclosure and may include, for example, at least one of the pixel arrays PXA described with reference to FIGS. 27 to 30. The active pixel sensor array 10 may be driven by a plurality of driving signals (e.g., a pixel selection signal, a reset signal, and a charge transfer signal) provided from the row driver 30. The electrical signals converted in the active pixel sensor array 10 may be provided to the correlated double sampler 60.

The row driver 30 may provide a plurality of driving signals for driving a plurality of unit pixels to the active pixel sensor array 10 in response to signals decoded in the row decoder 20. When the unit pixels are arranged in a matrix form, the driving signals may be provided in the unit of row. The controller 50 may control operations of the image sensor and may provide control signals to the row decoder 20 and the column decoder 40.

The correlated double sampler 60 may receive electrical signals generated from the active pixel sensor array 10 and may hold and sample the received electrical signals. The correlated double sampler 60 may doubly sample a specific noise level and a signal level of the electrical signal and may output a difference level corresponding to a difference between the noise level and the signal level.

The analog-to-digital converter 70 may convert an analog signal, which corresponds to the difference level outputted from the correlated double sampler 60, into a digital signal and may output the digital signal. The I/O buffer 80 may sequentially output digital signals in response to signals decoded in the column decoder 40.

According to the embodiments of the disclosure, it is possible to easily manufacture the image sensor capable of increasing the sensitivity of the incident light and of sensing the polarization of the light.

At least one of the components, elements, modules or units (collectively "components" in this paragraph) represented by a block in the drawings in FIG. 31 may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Further, although a bus is not illustrated in the above block diagrams, communication between the components may be performed through the bus. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

While the disclosure have been described with reference to example embodiments, it will be apparent to those skilled in the art that various changes and modifications may be made without departing from the spirits and scopes of the disclosure. Therefore, it should be understood that the above embodiments are not limiting, but illustrative. Thus, the scopes of the disclosure are to be determined by the broadest permissible interpretation of the following claims and their equivalents, and shall not be restricted or limited by the foregoing description.

What is claimed is:

1. An image sensor comprising:
 a substrate having a first surface and a second surface opposite to each other;
 a photoelectric conversion region provided in the substrate; and
 a polarizer provided at the first surface of the substrate, wherein the polarizer comprises:
a lower structure comprising at least one trench recessed from the first surface of the substrate extending toward the photoelectric conversion region; and
a plurality of upper patterns provided on the lower structure and spaced apart from each other in a first direction parallel to the first surface,
wherein the substrate is a single layer structure.

2. The image sensor of claim 1, further comprising:
device isolation patterns provided in the substrate,
wherein the photoelectric conversion region and the at least one trench are provided between the device isolation patterns.

3. The image sensor of claim 2, wherein the lower structure further comprises at least one lower pattern including the at least one trench, and
wherein the at least one lower pattern is a protruding portion at the first surface of the substrate.

4. The image sensor of claim 3, wherein the lower structure further comprises a lower insulating pattern provided in the at least one trench.

5. The image sensor of claim 4, wherein each of the upper patterns comprises:
a first upper pattern provided on the lower structure; and
a second upper pattern between the lower structure and the first upper pattern,
wherein the first upper pattern includes at least one of a metal or a high-k dielectric material, and the second upper pattern includes a low-k dielectric material.

6. The image sensor of claim 4, wherein the lower structure further comprises a passivation layer provided between an inner surface of the at least one trench and the lower insulating pattern, and
wherein the passivation layer extends onto a top surface of the at least one lower pattern.

7. The image sensor of claim 6, wherein each of the upper patterns comprises:
a first upper pattern provided on the lower structure; and
a second upper pattern provided between the lower structure and the first upper pattern,
wherein the first upper pattern includes at least one of a metal or a high-k dielectric material, and the second upper pattern includes a low-k dielectric material, and
wherein the second upper pattern is in direct contact with at least one of the passivation layer or the lower insulating pattern of the lower structure.

8. The image sensor of claim 6, wherein each of the upper patterns is a single-layered pattern including at least one of a metal or a high-k dielectric material, and
wherein each of the upper patterns is in direct contact with at least one of the passivation layer or the lower insulating pattern of the lower structure.

9. The image sensor of claim 1, further comprising:
device isolation patterns provided in the substrate,
wherein the lower structure comprises:
a plurality of trenches recessed from the first surface of the substrate toward the photoelectric conversion region; and
a plurality of lower patterns provided between the plurality of trenches,
wherein the photoelectric conversion region, the plurality of trenches and the plurality of lower patterns are provided between the device isolation patterns.

10. The image sensor of claim 9, wherein the lower structure further comprises a plurality of lower insulating patterns provided in the plurality of trenches, respectively.

11. The image sensor of claim 10, wherein each of the plurality of upper patterns vertically overlaps with at least one of the plurality of lower patterns and the plurality of lower insulating patterns.

12. The image sensor of claim 10, wherein the plurality of upper patterns are aligned on the plurality of lower patterns, respectively.

13. The image sensor of claim 10, wherein the plurality of upper patterns are aligned on the plurality of lower insulating patterns, respectively.

14. The image sensor of claim 10, wherein each of the plurality of upper patterns vertically overlaps with a corresponding one of the plurality of lower patterns and a corresponding one of the plurality of lower insulating patterns.

15. The image sensor of claim 9,
wherein a first width of each of the plurality of upper patterns in the first direction is less than a second width of each of the plurality of lower patterns and a third width of each of the plurality of trenches in the first direction.

16. The image sensor of claim 9, wherein each of the plurality of upper patterns comprises:
a first upper pattern on the lower structure; and
a second upper pattern between the lower structure and the first upper pattern,
wherein a first thickness of each of the plurality of lower patterns in a second direction perpendicular to the first surface is greater than a second thickness of the first upper pattern and a third thickness of the second upper pattern in the second direction.

17. An image sensor comprising:
a substrate having a first surface and a second surface opposite to each other;
device isolation patterns provided in the substrate;
a photoelectric conversion region provided in the substrate and provided between the device isolation patterns; and
a polarizer provided at the first surface of the substrate,
wherein the polarizer comprises:
a lower structure comprising:
a plurality of lower patterns protruding from the substrate;
lower insulating patterns provided between the plurality of lower patterns; and
upper patterns provided on the lower structure,
wherein the lower structure is provided between the photoelectric conversion region and the upper patterns and between the device isolation patterns, and
wherein the substrate is a single layer structure.

18. The image sensor of claim 17, wherein the upper patterns are spaced apart from each other in a first direction parallel to the first surface of the substrate and extend in a second direction which is parallel to the first surface of the substrate and intersects the first direction, and
wherein the lower patterns and the lower insulating patterns are alternately arranged in the first direction and extend in the second direction.

19. The image sensor of claim 18, wherein each of the upper patterns vertically overlaps with at least one of the lower patterns and the lower insulating patterns.

20. The image sensor of claim 18, wherein the lower structure further comprises a passivation layer provided between the lower patterns and the lower insulating patterns,
wherein the passivation layer extends onto top surfaces of the lower patterns, and wherein each of the upper patterns is in direct contact with at least one of the passivation layer and the lower insulating patterns.

* * * * *